(12) United States Patent
Kishimoto et al.

(10) Patent No.: US 8,734,593 B2
(45) Date of Patent: May 27, 2014

(54) SUBSTRATE TREATMENT APPARATUS AND SUBSTRATE TREATMENT METHOD

(75) Inventors: Takuya Kishimoto, Kyoto (JP); Koji Ando, Kyoto (JP)

(73) Assignee: Dainippon Screen Mfg. Co., Ltd. (JP)

( * ) Notice: Subject to any disclaimer, the term of this patent is extended or adjusted under 35 U.S.C. 154(b) by 367 days.

(21) Appl. No.: 13/044,925

(22) Filed: Mar. 10, 2011

(65) Prior Publication Data

US 2011/0240067 A1 Oct. 6, 2011

(30) Foreign Application Priority Data

Mar. 30, 2010 (JP) ................................. 2010-079527

(51) Int. Cl.
*B08B 3/02* (2006.01)
*B08B 3/04* (2006.01)
*B08B 11/02* (2006.01)

(52) U.S. Cl.
USPC ................. 134/33; 134/18; 134/34; 134/153; 134/157; 134/199; 134/902

(58) Field of Classification Search
USPC ..................................... 134/1.3, 33, 157, 902
See application file for complete search history.

(56) References Cited

U.S. PATENT DOCUMENTS

| | | | |
|---|---|---|---|
| 6,357,457 B1 | 3/2002 | Taniyama et al. | |
| 6,374,836 B1* | 4/2002 | Oroku | 134/153 |
| 6,602,382 B1 | 8/2003 | Matsuyama et al. | |
| 2003/0196683 A1 | 10/2003 | Izumi et al. | |
| 2004/0216841 A1 | 11/2004 | Ito et al. | |
| 2005/0178402 A1* | 8/2005 | Stowell et al. | 134/1.3 |
| 2005/0276921 A1* | 12/2005 | Miya et al. | 427/240 |
| 2006/0130872 A1 | 6/2006 | Izumi et al. | |
| 2006/0219264 A1 | 10/2006 | Miya | |
| 2007/0181149 A1* | 8/2007 | Ko et al. | 134/2 |

FOREIGN PATENT DOCUMENTS

| | | |
|---|---|---|
| CN | 1794430 | 6/2006 |
| JP | 11-319732 | 11/1999 |
| JP | 2003-124180 | 4/2003 |
| JP | 2005-235945 | 9/2005 |
| JP | 2005-243940 | 9/2005 |
| JP | 2006-278655 | 10/2006 |
| JP | 2009-266951 | 11/2009 |
| JP | 2009-277872 | 11/2009 |
| KR | 10-2001-0051270 | 6/2001 |

* cited by examiner

*Primary Examiner* — Michael Kornakov
*Assistant Examiner* — Natasha Campbell
(74) *Attorney, Agent, or Firm* — Ostrolenk Faber LLP

(57) ABSTRACT

A substrate treatment apparatus includes: substrate holding unit which horizontally holds a substrate; a rotating unit which rotates the substrate held by the substrate holding unit about a vertical axis; and a first nozzle having a first opposing face to be opposed to a region of a lower surface of the substrate inward of a peripheral portion of the substrate in spaced relation to the lower surface of the substrate during rotation of the substrate by the rotating unit and a treatment liquid spout provided in the first opposing face for filling a space defined between the lower surface of the substrate and the first opposing face with a treatment liquid spouted from the treatment liquid spout to keep the space in a liquid filled state.

19 Claims, 12 Drawing Sheets

SUBSTRATE TREATMENT APPARATUS AND SUBSTRATE TREATMENT METHOD

BACKGROUND OF THE INVENTION

1. Field of the Invention

The present invention relates to a substrate treatment apparatus and a substrate treatment method for cleaning a peripheral portion of a substrate. Examples of the substrate to be treated include semiconductor wafers, glass substrates for liquid crystal display devices, substrates for plasma display devices, substrates for FED (Field Emission Display) devices, substrates for optical disks, substrates for magnetic disks, substrates for magneto-optical disks, substrates for photo masks, and substrates for photovoltaic cells.

2. Description of Related Art

In a semiconductor device production process, a thin metal film is formed on a device formation surface of a generally round substrate or a semiconductor wafer (hereinafter referred to simply as "wafer"), and then an etching process is often performed to etch away unnecessary portions of the thin metal film. Where the thin metal film is also formed on a peripheral portion of the wafer, for example, the metal is likely to contaminate a hand of a transport robot during the handling of the wafer by the transport robot, and the contamination is transferred to other wafers. Therefore, the unnecessary portions of the thin metal film are removed from the peripheral portion of the wafer.

A substrate treatment apparatus adapted to remove the thin metal film from the peripheral portion of the wafer includes, for example, a spin chuck which horizontally holds and rotates the wafer, and an etching liquid nozzle which supplies an etching liquid to a lower surface of the wafer. The wafer is held by the spin chuck with its front surface (formed with the device formation region) facing up. A center axis nozzle inserted through a rotation shaft of the spin chuck is used as the etching liquid nozzle. The center axis nozzle has a spout provided at an upper end thereof in opposed relation to a center portion of the lower surface of the wafer held by the spin chuck. When the etching liquid spouted from the spout reaches the lower surface of the wafer, the etching liquid receives a centrifugal force to spread outward radially about a rotation center, and flows around to an upper surface of the wafer from a peripheral edge of the wafer. Thus, the unnecessary portions are etched away from a peripheral portion of the upper surface of the wafer. The etching process (so-called bevel etching process) is performed on a region of the peripheral portion of the upper surface of the wafer having a predetermined width (e.g., 0.5 to 1.5 mm) by controlling the flow rate of the etching liquid spouted from the etching liquid nozzle and the rotation speed of the spin chuck (see US2003/196683A1).

With the aforementioned arrangement, however, it is difficult to precisely control the width (treatment width) of the region of the upper surface of the wafer from which the thin metal film is removed.

Where the lower surface of the wafer (or a surface of the thin film formed on the lower surface of the wafer) has in-plane variations in hydrophilicity, the etching liquid is liable to move toward the lower surface peripheral portion of the wafer along higher hydrophilicity regions of the lower surface. Therefore, the etching liquid does not necessarily spread uniformly but radially linearly, so that the etching liquid is supplied at different flow rates to the peripheral portion of the wafer. Therefore, the etching liquid flow-around amount varies over the peripheral portion of the wafer.

Further, the flow rate of the etching liquid spouted from the etching liquid nozzle is liable to be unstable at the start of the spouting of the etching liquid. Even after a lapse of a certain period of time from the start of the spouting of the etching liquid, the flow rate of the etching liquid spouted from the etching liquid nozzle is liable to be momentarily changed due to pulsation of a pump. If the flow rate of the etching liquid spouted from the etching liquid nozzle is changed during the etching process, the flow rate of the etching liquid supplied to the peripheral portion of the wafer is also changed. Therefore, the amount of the etching liquid flowing around to the upper surface of the wafer is liable to differ from a desired flow-around amount.

The same problem occurs not only in the bevel etching process but also when the upper surface peripheral portion of the wafer is treated (cleaned) with a chemical agent such as a cleaning agent.

SUMMARY OF THE INVENTION

It is therefore an object of the present invention to provide a substrate treatment apparatus and a substrate treatment method which permit precise control of a treatment width on an upper surface peripheral portion of a substrate.

A substrate treatment apparatus according to the present invention is adapted to treat a peripheral portion of a substrate with a treatment liquid, and includes: a substrate holding unit which horizontally holds the substrate; a rotating unit which rotates the substrate held by the substrate holding unit about a vertical axis; and a first nozzle having a first opposing face to be opposed to a region of a lower surface of the substrate inward of the peripheral portion in spaced relation to the lower surface of the substrate during rotation of the substrate by the rotating unit and a treatment liquid spout provided in the first opposing face arranged to spout the treatment liquid to fill a space defined between the lower surface of the substrate and the first opposing face with the treatment liquid spouted from the treatment liquid spout to keep the space in a liquid filled state.

With this arrangement, the space defined between the lower surface of the substrate and the first opposing face of the first nozzle is filled with the treatment liquid spouted from the treatment liquid spout to be kept in the liquid filled state, so that the treatment liquid contacts and entirely covers the region of the lower surface of the substrate opposed to the first opposing face. The substrate is rotated about the vertical axis. The treatment liquid contacting the lower surface of the substrate receives a centrifugal force generated by the rotation of the substrate to spread outward radially about a rotation center over a region of the lower surface of the substrate not opposed to the first opposing face, and flows around to an upper surface of the substrate from a peripheral edge of the substrate.

When the treatment liquid supplied to the lower surface of the substrate moves toward the peripheral portion over the lower surface of the substrate, the space defined between the first opposing face of the first nozzle and the region of the lower surface of the substrate opposed to the first opposing face is kept in the liquid filled state, so that the treatment liquid is supplied to entirely cover the region of the lower surface of the substrate opposed to the first opposing face. Therefore, the supply of the treatment liquid is not influenced by the surface state (variations in hydrophilicity and the like) of this region of the lower surface of the substrate. Since the treatment liquid supplied to the lower surface of the substrate easily uniformly spreads outward radially about the rotation center, the treatment liquid is uniformly supplied at a constant flow rate to any region of the peripheral portion of the substrate. Thus, the amount of the treatment liquid flowing around from the peripheral edge of the substrate is uniform at any region of the peripheral portion of the substrate.

With the treatment liquid being spouted from the first nozzle, a puddle of the treatment liquid is formed between the lower surface of the substrate and the first opposing face of the first nozzle. Even if the flow rate of the treatment liquid supplied to the lower surface of the substrate is changed, the change in supply flow rate is accommodated by the treatment liquid puddle formed on the lower surface of the substrate. Therefore, even if the flow rate of the treatment liquid spouted from the first nozzle is changed, it is possible to suppress a sudden change in the flow rate of the treatment liquid supplied to the peripheral portion of the substrate. Thus, the amount of the treatment liquid flowing around from the peripheral edge of the substrate can be maintained at a desired level.

In this manner, the treatment width on a peripheral portion of the upper surface of the substrate can be precisely controlled.

The first opposing face may include a flat surface to be opposed to the lower surface of the substrate held by the substrate holding unit.

The first opposing face may include an inner opposing surface provided with the treatment liquid spout, and an outer opposing surface provided annularly around the inner opposing surface to be brought into more closely opposed relation to the lower surface of the substrate held by the substrate holding unit than the inner opposing surface.

In the substrate treatment apparatus, a portion of the first nozzle including the first opposing face may be composed of a hydrophilic material.

The substrate treatment apparatus preferably further includes a second nozzle which spouts the treatment liquid toward a part of the peripheral portion of the upper surface of the substrate held by the substrate holding unit. With this arrangement, the treatment liquid spouted from the second nozzle is supplied to the peripheral portion of the upper surface of the substrate. Further, the treatment liquid spouted from the first nozzle is supplied to the lower surface of the substrate. In this case, both the treatment liquid spouted from the first nozzle and flowing around from the peripheral edge of the substrate and the treatment liquid spouted from the second nozzle are supplied to the peripheral portion of the upper surface of the substrate. If the treatment liquid flow-around amount is excessively great in this arrangement, the treatment liquid flowing around from the peripheral edge of the substrate is liable to heavily collide with the treatment liquid spouted from the second nozzle and scatter around to adhere to a center portion (a region inward of the peripheral portion) of the upper surface of the substrate.

According to the present invention, on the other hand, the width of a region of the upper surface of the substrate covered with the treatment liquid flowing around from the peripheral edge of the substrate (flow-around width) can be precisely controlled. This suppresses interference between the treatment liquid spouted from the first nozzle and the treatment liquid spouted from the second nozzle to prevent the treatment liquid from scattering around. This further prevents the center portion of the front surface (upper surface) of the substrate from being adversely affected.

In this case, the substrate treatment apparatus may further include an opposing member having a second opposing face to be opposed to the upper surface of the substrate held by the substrate holding unit and an insertion hole which opens in the second opposing face, and may be configured such that the second nozzle is arranged to be inserted in the insertion hole.

A substrate treatment method according to the present invention is adapted to treat a peripheral portion of a substrate with a treatment liquid by spouting the treatment liquid from a first nozzle having an opposing face to be brought into opposed spaced relation to a lower surface of the substrate, and includes: a rotating step of rotating the substrate about a vertical axis; and a lower surface liquid contacting step of supplying the treatment liquid to a space defined between the lower surface of the substrate and the opposing face from a treatment liquid spout provided in the opposing face to keep the space defined between the lower surface of the substrate and the opposing face in a liquid filled state to cause the treatment liquid to contact the lower surface of the substrate, the lower surface liquid contacting step being performed simultaneously with the rotating step.

According to the present invention, the space defined between the lower surface of the substrate and the first opposing face of the first nozzle is filled with the treatment liquid spouted from the treatment liquid spout to be kept in the liquid filled state, whereby the treatment liquid contacts and entirely covers a region of the lower surface of the substrate opposed to the opposing face. Further, the substrate is rotated about the vertical axis. The treatment liquid contacting the lower surface of the substrate receives a centrifugal force generated by the rotation of the substrate to spread outward radially about a rotation center over a region of the lower surface of the substrate not opposed to the first opposing face, and flows around to an upper surface of the substrate from a peripheral edge of the substrate.

When the treatment liquid supplied to the lower surface of the substrate moves toward a peripheral portion of the lower surface of the substrate, the space defined between the opposing face of the first nozzle and the region of the lower surface of the substrate opposed to the opposing face is kept in the liquid filled state, so that the treatment liquid is supplied to entirely cover the region of the lower surface of the substrate opposed to the opposing face. Therefore, the supply of the treatment liquid is not influenced by the surface state (variations in hydrophilicity and the like) of this region of the lower surface of the substrate. Since the treatment liquid supplied to the lower surface of the substrate easily uniformly spreads outward radially about the rotation center, the treatment liquid is uniformly supplied at a constant flow rate to any region of the peripheral portion of the substrate. Thus, the amount of the treatment liquid flowing around from the peripheral edge of the substrate is uniform at any region of the peripheral portion of the substrate.

With the treatment liquid being spouted from the first nozzle, a puddle of the treatment liquid is formed between the lower surface of the substrate and the first opposing face of the first nozzle. Even if the flow rate of the treatment liquid supplied to the lower surface of the substrate is changed, the change in supply flow rate is accommodated by the treatment liquid puddle formed on the lower surface of the substrate. Therefore, even if the flow rate of the treatment liquid spouted from the first nozzle is changed, it is possible to suppress a sudden change in the flow rate of the treatment liquid supplied to the peripheral portion of the substrate. Thus, the amount of the treatment liquid flowing around from the peripheral edge of the substrate can be maintained at a desired level.

In this manner, the treatment width on a peripheral portion of the upper surface of the substrate can be precisely controlled.

The substrate treatment method preferably further includes an upper surface treatment liquid supplying step of spouting the treatment liquid toward a part of the peripheral portion of the upper surface of the substrate from a second nozzle, the upper surface treatment liquid supplying step being performed simultaneously with the rotating step and the lower surface liquid contacting step. In this method, the treatment liquid spouted from the second nozzle is supplied to the peripheral portion of the upper surface of the substrate. Further, the treatment liquid spouted from the first nozzle is supplied to the lower surface of the substrate. In this case, both the treatment liquid spouted from the first nozzle and flowing around from the peripheral edge of the substrate and the treatment liquid spouted from the second nozzle are supplied to the peripheral portion of the upper surface of the substrate. If the treatment liquid flow-around amount is excessively great in this method, the treatment liquid flowing around from the peripheral edge of the substrate is liable to heavily collide with the treatment liquid spouted from the second nozzle and scatter around to adhere to a center portion (a region inward of the peripheral portion) of the upper surface of the substrate.

According to the present invention, on the other hand, the width of a region of the upper surface of the substrate covered with the treatment liquid flowing around from the peripheral edge of the substrate (flow-around width) can be precisely controlled. This suppresses interference between the treatment liquid spouted from the first nozzle and the treatment liquid spouted from the second nozzle to prevent the treatment liquid from scattering around. This further prevents the center portion of the front surface (upper surface) of the substrate from being adversely affected.

In this case, the method may further include: an opposing member placing step of placing an opposing member in opposed relation to the upper surface of the substrate, the opposing member having an insertion hole in which the second nozzle is to be inserted, the opposing member placing step being performed simultaneously with the rotating step, the lower surface liquid contacting step and the upper surface treatment liquid supplying step; and a nozzle placing step of inserting the second nozzle into the insertion hole of the opposing member to place the second nozzle in opposed relation to the upper surface of the substrate, the nozzle placing step being performed simultaneously with the opposing member placing step.

The foregoing and other objects, features and effects of the present invention will become more apparent from the following detailed description of preferred embodiments with reference to the attached drawings.

DETAILED DESCRIPTION OF PREFERRED EMBODIMENTS

Figure 1:
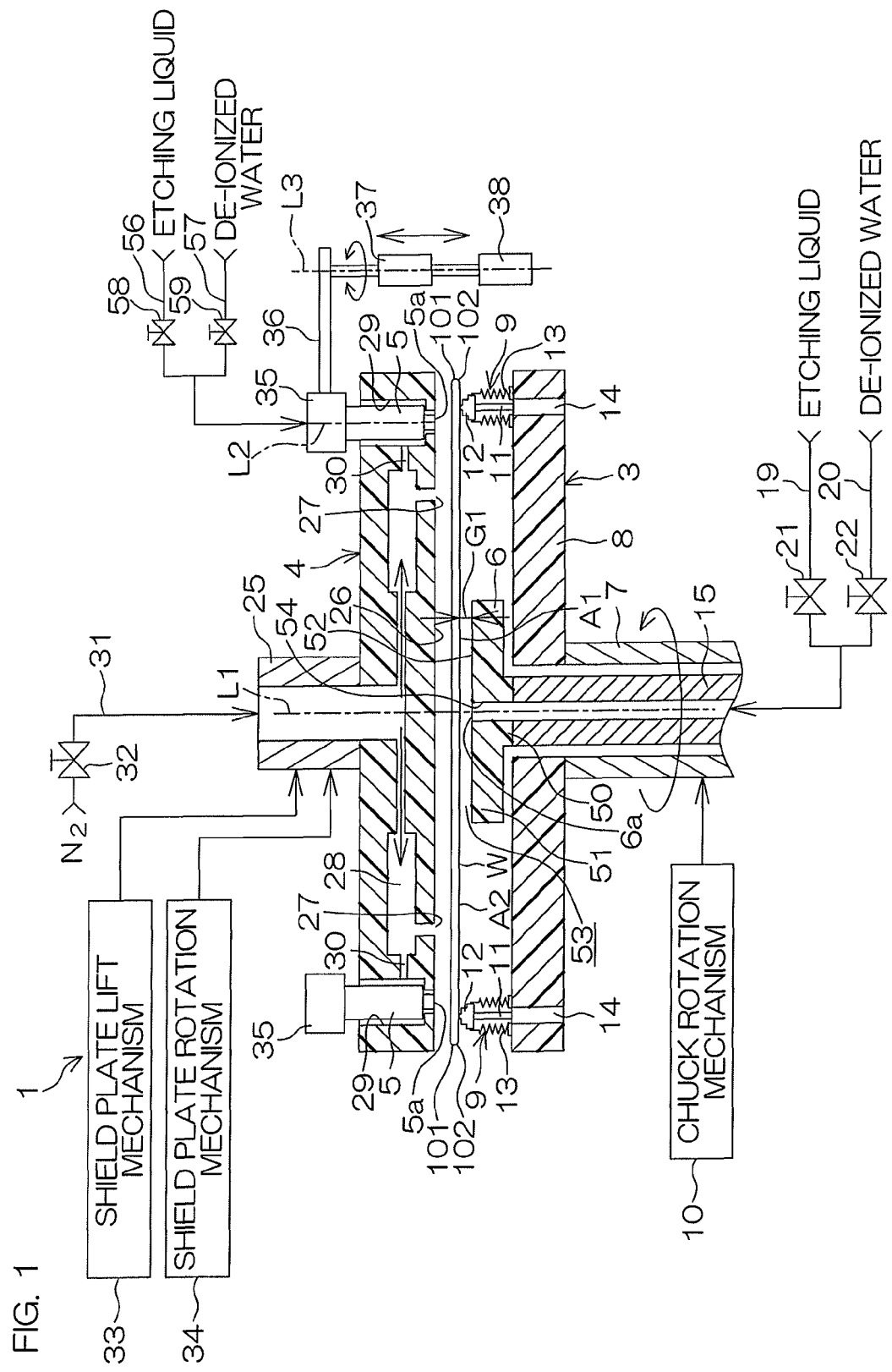
FIG. 1 is a sectional view schematically showing the construction of a substrate treatment apparatus according to a first embodiment of the present invention.

FIG. 1 is a sectional view schematically showing the construction of a substrate treatment apparatus 1 according to one embodiment (first embodiment) of the present invention. The substrate treatment apparatus 1 is capable of removing a thin film from a peripheral portion (e.g., an annular region having a width of 1.0 to 3.0 mm as measured from a peripheral edge of a wafer W, and hereinafter referred to as "front surface peripheral portion") 101 of a front surface (a surface formed with a device formation region) of the wafer W and from a peripheral surface 102 of the wafer W. A center portion of the front surface of the wafer W inward of the front surface peripheral portion 101 includes the device formation region, in which a transistor and other element (device) are formed.

The substrate treatment apparatus 1 includes a spin chuck (substrate holding unit) 3 which horizontally holds and rotates the wafer W, a shield plate (opposing member) 4 disposed above the spin chuck 3, two upper nozzles (second nozzle) 5 which spout a treatment liquid toward the peripheral portion of the upper surface (front surface peripheral portion 101) of the wafer W, and a lower nozzle (first nozzle) 6 which spouts the treatment liquid toward a center portion of a lower surface of the wafer W. The spin chuck 3, the shield plate 4, the upper nozzles 5 and the lower nozzle 6 are disposed in a treatment chamber (not shown) defined by a partition wall (not shown).

The spin chuck 3 includes a rotation shaft 7 extending generally vertically, a disk-shaped spin base 8 attached to an upper end of the rotation shaft 7 in a generally horizontal attitude, and a plurality of abutment pins 9 provided on a peripheral portion of an upper surface of the spin base 8. The abutment pins 9 are equidistantly arranged along a circle defined about a center axis of the rotation shaft 7 on the upper surface of the spin base 8. The wafer W is horizontally placed above the spin base 8 with a peripheral portion of the lower surface thereof in abutment against the abutment pins 9. The wafer W is pressed against the abutment pins 9 by an inert gas applied thereto from gas outlet ports 27 of the shield plate 4 (to be described later), and supported on the abutment pins 9 by frictional forces occurring between upper portions of the respective abutment pins 9 and the lower surface of the wafer W. In a thin film removing process, the wafer W is supported on the abutment pins 9 with its front surface up.

A rotation force is inputted to the rotation shaft 7 from a chuck rotation mechanism (rotating unit) 10 including a motor (not shown) and the like. The wafer W is rotated together with the spin base 8 about the center axis of the rotation shaft 7 by inputting the rotation force to the rotation shaft 7 from the chuck rotation mechanism 10 with the wafer W supported on the abutment pins 9.

Figure 2:
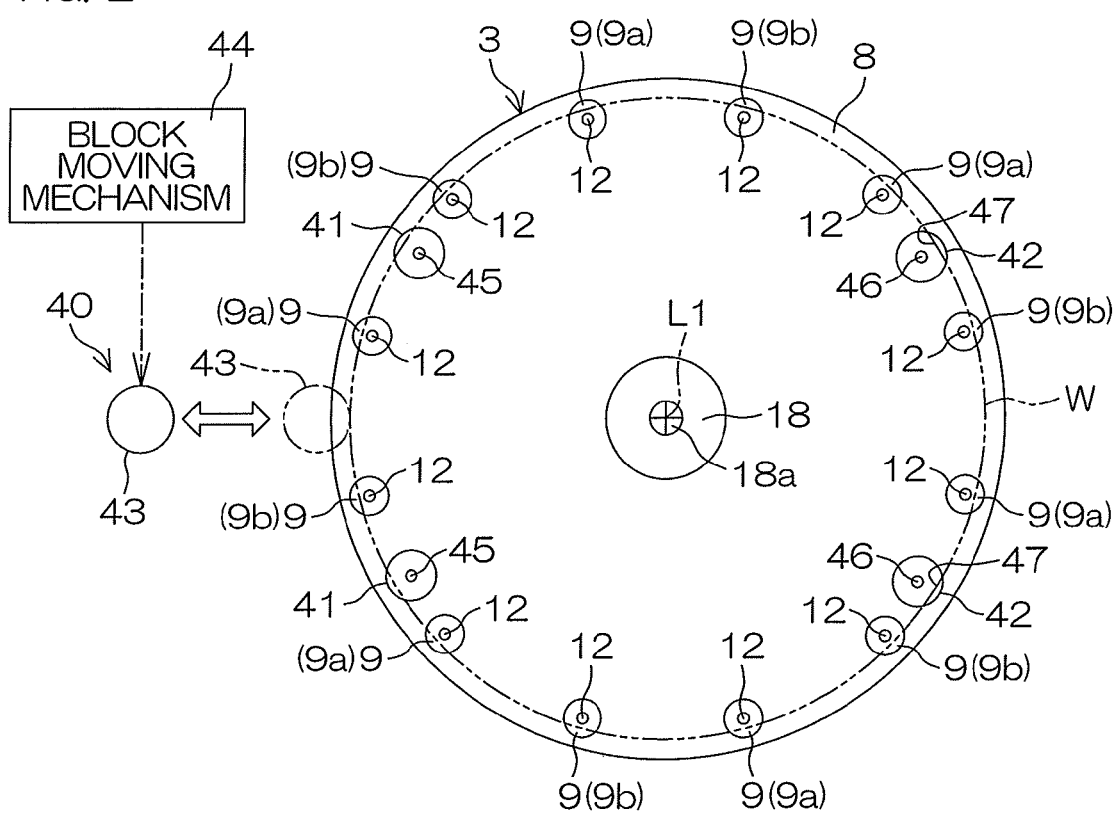
FIG. 2 is a plan view of a spin chuck and an arrangement related to the spin chuck shown in FIG. 1.

FIG. 2 is a plan view of the spin chuck 3 and an arrangement related to the spin chuck 3. Referring to FIGS. 1 and 2, the abutment pins 9 and an arrangement related to the abutment pins 9 will be described.

The abutment pins 9 each include a rod 11 extending vertically, a first support portion 12 connected to an upper end of the rod 11, a tubular bellows 13 surrounding the rod 11, and a pin lift mechanism 14 which moves up and down the rod 11 and the first support portion 12 together. The first support portions 12 of the respective abutment pins 9 are configured so as to be brought into point-contact with the peripheral portion of the lower surface of the wafer W. The first support portions 12 are each vertically moved up and down between a support position and a retracted position located just below the support position by the corresponding pin lift mechanism 14. The support positions of the respective first support portions 12 are located at the same height level. The retracted positions of the respective first support portions 12 are located at the same height level. The wafer W supported by the abutment pins 9 is vertically moved up and down above the spin base 8 by moving up and down the abutment pins 9 in synchronism. The abutment pins 9 are classified into two groups: a first abutment pin group 9a and a second abutment pin group 9b each including three or more abutment pins 9. The abutment pins 9 of the first abutment pin group 9a are moved up and down in synchronism. Similarly, the abutment pins 9 of the second abutment pin group 9b are moved up and down in synchronism. The abutment pins 9 of the first abutment pin group 9a and the abutment pins 9 of the second abutment pin group 9b are alternately arranged circumferentially of the spin base 8.

Referring again to FIG. 1, the rotation shaft 7 has a hollow inside. A lower treatment liquid supply pipe 15 is inserted through the rotation shaft 7. The lower nozzle 6 is fixed to an upper end of the lower treatment liquid supply pipe 15.

A lower etching liquid supply pipe 19 and a lower de-ionized water supply pipe 20 are connected to the lower treatment liquid supply pipe 15. An etching liquid is supplied to the lower etching liquid supply pipe 19 from an etching liquid supply source. A lower etching liquid valve 21 for opening and closing the lower etching liquid supply pipe 19 is provided in the lower etching liquid supply pipe 19. De-ionized water is supplied to the lower de-ionized water supply pipe 20 from a de-ionized water supply source. A lower de-ionized water valve 22 for opening and closing the lower de-ionized water supply pipe 20 is provided in the lower de-ionized water supply pipe 20. The etching liquid and the de-ionized water are selectively supplied to the lower treatment liquid supply pipe 15 by controlling the opening and closing of the lower etching liquid valve 21 and the lower de-ionized water valve 22.

The type of the etching liquid to be supplied to the lower treatment liquid supply pipe 15 depends on the type of a thin film to be removed from the peripheral portion of the wafer W. Where a metal film such as a thin copper film is to be removed from the peripheral portion of the wafer W, for example, SC2 (hydrochloric acid/hydrogen peroxide mixture), a hydrofluoric acid/hydrogen peroxide mixture or nitric acid is used as the etching liquid. Where a polysilicon film, an amorphous silicon film or a silicon oxide film is to be removed from the wafer W, for example, a hydrofluoric acid/nitric acid mixture is used as the etching liquid. Further, where an oxide film or a nitride film is to be removed from the wafer W, for example, DHF (diluted hydrofluoric acid) or a hydrofluoric acid solution such as containing hydrofluoric acid at a concentration of 50% is used as the etching liquid.

Figure 3:
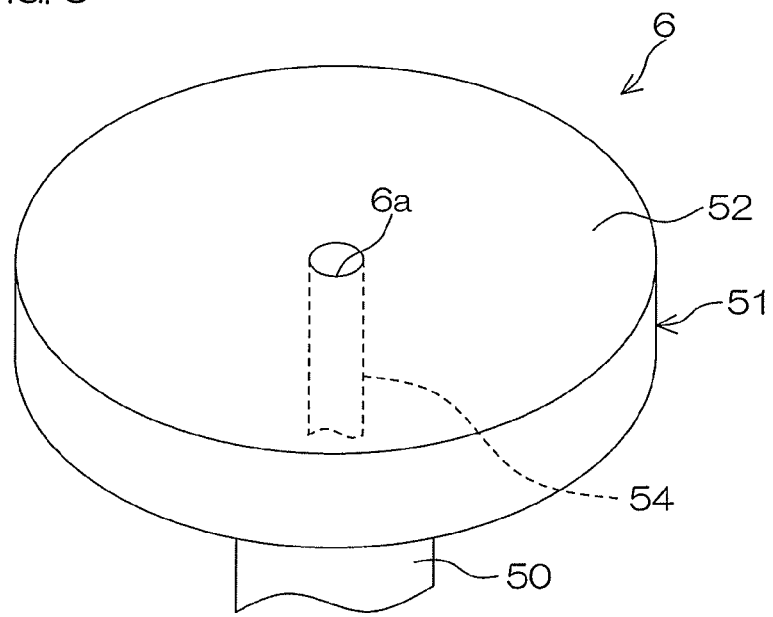
FIG. 3 is a perspective view of a lower nozzle shown in FIG. 1.
Figure 4:
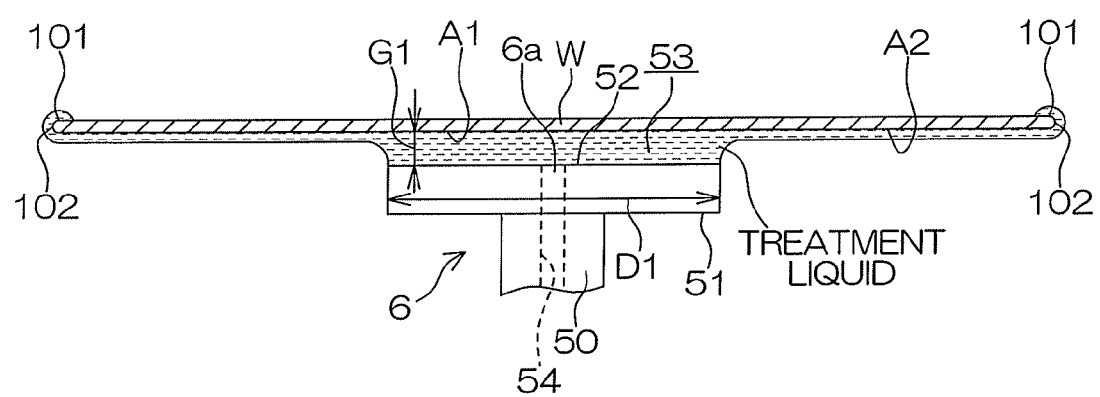
FIG. 4 is a diagram showing a treatment with a treatment liquid spouted from the lower nozzle shown in FIG. 1.

FIG. 3 is a perspective view of the lower nozzle 6. FIG. 4 is a diagram showing a treatment with the treatment liquid spouted from the lower nozzle 6.

Referring to FIGS. 1, 3 and 4, the lower nozzle 6 will be described. The lower nozzle 6 includes a hollow cylindrical portion 50 fixed to the upper end of the lower treatment liquid supply pipe 15, and a disk portion 51 fixed to an upper end of the hollow cylindrical portion 50. The disk portion 51 has a disk shape having a center aligned with the center axis of the rotation shaft 7. The disk portion 51 has a diameter D1 that is smaller than the diameter of the wafer W held by the spin chuck 3 (e.g., about one third the diameter of the wafer W). The disk portion 51 has an upper surface (first opposing face, opposing face) 52 which is a horizontal flat surface and is opposed to the lower surface of the wafer W held by the spin chuck 3. The vertical height level of the lower nozzle 6 is defined such that the upper surface 52 of the disk portion 51 is spaced a predetermined distance G1 from the lower surface of the wafer W held by the spin chick 3.

The disk portion 51 has a round treatment liquid spout 6a provided in a center portion of the upper surface 52 thereof for spouting the treatment liquid (the etching liquid or the de-ionized water). The treatment liquid spout 6a is located on the center axis of the rotation shaft 7. The treatment liquid spout 6a and the lower treatment liquid supply pipe 15 are connected to each other by a connection passage 54 extending through the disk portion 51 and the hollow cylindrical portion 50. Therefore, the treatment liquid supplied to the connection passage 54 from the lower treatment liquid supply pipe 15 is spouted upward from the treatment liquid spout 6a. The disk portion 51 and the hollow cylindrical portion 50 are integrally formed of a chemical-resistant material such as PCTFE (polychlorotrifluoroethylene).

When the treatment liquid (the etching liquid or the de-ionized water) is spouted upward from the treatment liquid spout 6a with the wafer W being rotated, the treatment liquid spouted from the treatment liquid spout 6a hits the lower surface of the wafer W to keep a space 53 defined between the lower surface of the wafer W and the upper surface 52 of the lower nozzle 6 in a liquid filled state. Then, the treatment liquid contacts and entirely covers a region (a region inward of the peripheral portion, and hereinafter referred to as "opposed region") A1 of the lower surface of the wafer W opposed to the upper surface 52. Thus, a puddle of the treatment liquid is formed between the lower surface of the wafer W and the upper surface 52 of the lower nozzle 6.

The treatment liquid contacting the lower surface of the wafer W receives a centrifugal force generated by the rotation of the wafer W, and spreads outward radially about the rotation center over a region (hereinafter referred to as "non-opposed region") A2 of the lower surface of the wafer W not opposed to the upper surface 52 of the lower nozzle 6 to reach the peripheral surface 102 of the wafer W. Then, the treatment liquid flows around the peripheral surface 102 to reach the peripheral portion of the upper surface of the wafer W (front surface peripheral portion 101).

Figure 5:
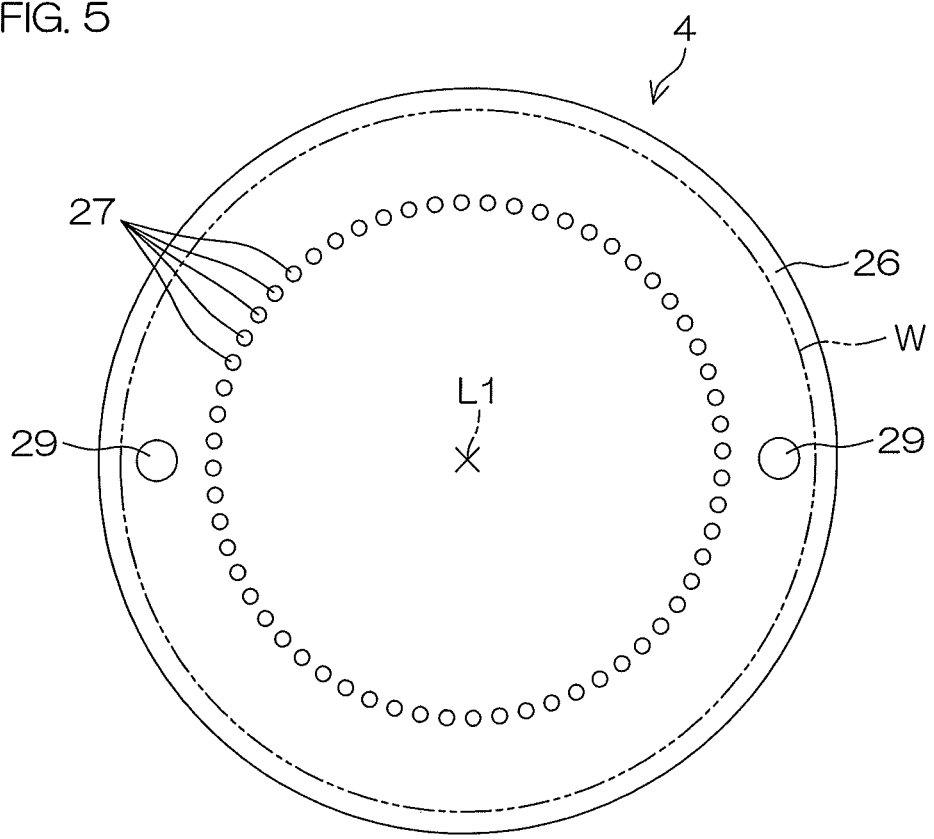
FIG. 5 is a bottom view of a shield plate shown in FIG. 1.

FIG. 5 is a bottom view of the shield plate 4. Referring to FIGS. 1 and 5, the shield plate 4 will be described. The shield plate 4 has a disk shape having a hollow inside. The shield plate 4 assumes a horizontal attitude, and is connected to a lower end of a support shaft 25 having a hollow inside. The inside space of the shield plate 4 communicates with the inside space of the support shaft 25. The shield plate 4 has a center axis aligned with the rotation center axis L1 of the spin chuck 3. The shield plate 4 has a round flat lower surface (second opposing surface) 26, a plurality of gas outlet ports 27 provided in the lower surface 26 of the shield plate 4, a communication space 28 provided in the shield plate 4, and two insertion holes 29 provided in a peripheral portion of the shield plate 4. The lower surface 26 of the shield plate 4 has a diameter that is substantially the same as or slightly greater than the diameter of the wafer W. The shield plate 4 is disposed with its lower surface 26 kept horizontally. The shield plate 4 is configured such that its lower surface 26 is opposed to the upper surface of the wafer W held by the spin chuck 3.

The gas outlet ports 27 are arranged in spaced relation along a predetermined circle defined about the center axis of the shield plate 4. The gas outlet ports 27 are disposed radially outward of a center portion of the shield plate 4. The gas outlet ports 27 communicate with the communication space 28. Further, the communication space 28 communicates with the insertion holes 29 through corresponding communication passages 30. The insertion holes 29 extend thicknesswise (vertically in FIG. 1) through the peripheral portion of the shield plate 4. As will be described later, the two upper nozzles 5 are inserted in the two corresponding insertion holes 29. The two insertion holes 29 are disposed symmetrically about the center axis of the shield plate 4.

An upper gas supply pipe 31 is connected to an upper end of the support shaft 25. An upper gas valve 32 is provided in the upper gas supply pipe 31. Nitrogen gas as an exemplary gas is supplied to the support shaft 25 through the upper gas supply pipe 31. The nitrogen gas supplied to the support shaft 25 flows through the communication space 28 of the shield plate 4 to be spouted downward from the respective gas outlet ports 27. The nitrogen gas flowing into the communication space 28 of the shield plate 4 is supplied into the respective insertion holes 29 through the corresponding communication passages 30. The nitrogen gas supplied into the insertion holes 29 is spouted upward and downward from upper and lower ends of the respective insertion holes 29. When the nitrogen gas is spouted from the respective gas outlet ports 27 with the wafer W being supported by the abutment pins 9 and with the shield plate 4 being located at a proximate position (a position shown in FIG. 1), the wafer W is pressed against the abutment pins 9 by the nitrogen gas applied thereto from the shield plate 4.

A shield plate lift mechanism 33 and a shield plate rotation mechanism 34 are connected to the support shaft 25. A driving force of the shield plate lift mechanism 33 is inputted to the support shaft 25, whereby the support shaft 25 and the shield plate 4 are moved up and down together between the proximate position at which the lower surface 26 of the shield plate 4 is located close to the upper surface of the wafer W held by the spin chuck 3 and a retracted position at which the shield plate 4 is retracted far above the spin chuck 3. Further, a driving force of the shield plate rotation mechanism 34 is inputted to the support shaft 25, whereby the support shaft 25 and the shield plate 4 are rotated together about the rotation center axis L1 of the spin chuck 3. The shield plate rotation mechanism 34 may be controlled, for example, so that the rotation of the shield plate 4 is synchronized with the rotation of the wafer W, or the shield plate 4 is rotated at a rotation speed different from that of the wafer W. The shield plate 4 may be fixed in a non-rotatable state without the provision of the shield plate rotation mechanism 34.

The upper nozzles 5 each have, for example, a cylindrical shape. The upper nozzles 5 are each disposed vertically. An upper etching liquid supply pipe 56 and an upper de-ionized water supply pipe 57 are connected to each of the upper nozzles 5. An etching liquid is supplied to the upper etching liquid supply pipe 56 from an etching liquid supply source. An upper etching liquid valve 58 for opening and closing the upper etching liquid supply pipe 56 is provided in the upper etching liquid supply pipe 56. De-ionized water is supplied to the upper de-ionized water supply pipe 57 from a de-ionized water supply source. An upper de-ionized water valve 59 for opening and closing the upper de-ionized water supply pipe 57 is provided in the upper de-ionized water supply pipe 57. The etching liquid and the de-ionized water are selectively supplied to the upper nozzles 5 by controlling the opening and closing of the upper etching liquid vale 58 and the upper de-ionized water valve 59.

The type of the etching liquid to be supplied to the upper nozzles 5 depends on the type of the thin film to be removed from the front surface peripheral portion 101 of the wafer W. Where a metal film such as a thin copper film is to be removed from the front surface peripheral portion 101 of the wafer W, for example, SC2 (hydrochloric acid/hydrogen peroxide mixture), a hydrofluoric acid/hydrogen peroxide mixture or nitric acid is used as the etching liquid. Where a polysilicon film, an amorphous silicon film or a silicon oxide film is to be removed from the wafer W, for example, a hydrofluoric acid/nitric acid mixture is used as the etching liquid. Further, where an oxide film or a nitride film is to be removed from the wafer W, for example, DHF (diluted hydrofluoric acid) or a hydrofluoric acid solution such as containing hydrofluoric acid at a concentration of 50% is used as the etching liquid.

Upper ends of the upper nozzles 5 are respectively connected to corresponding nozzle rotation mechanisms 35. The nozzle rotation mechanisms 35 are respectively connected to corresponding nozzle arms 36 (only one of which is shown in FIG. 1). The upper nozzles 5 are respectively supported by the corresponding nozzle arms 36. The upper nozzles 5 are respectively rotated about their center axes L2 (rotation axes) by the corresponding nozzle rotation mechanisms 35. The center axes L2 are each a vertically axis extending through the upper surface of the wafer W held by the spin chuck 3. The nozzle rotation mechanisms 35 each include an actuator such as a motor.

The nozzle arms 36 are respectively connected to corresponding arm pivot mechanisms 37 (only one of which is shown in FIG. 1). The arm pivot mechanisms 37 are respectively connected to corresponding arm lift mechanisms 38 (only one of which is shown in FIG. 1). The arm pivot mechanisms 37 are each configured so as to pivot the corresponding nozzle arm 36 about a vertical pivot axis L3 located in the vicinity of the spin chuck 3. The arm lift mechanisms 38 are each configured so as to vertically move up and down the corresponding nozzle arm 36. The upper nozzles 5 are horizontally moved by pivoting the nozzle arms 36 about the corresponding pivot axes L3. Further, the upper nozzles 5 are vertically moved by vertically moving up and down the corresponding nozzle arms 36.

The upper nozzles 5 are each horizontally moved between a retracted position and an intermediate position by the corresponding arm pivot mechanism 37. Further, the upper nozzles 5 are each vertically moved between the intermediate position and a treatment position (a position shown in FIG. 1) by the corresponding arm lift mechanism 38. The retracted position is located far away from the spin chuck 3 and the shield plate 4. The intermediate position is located just above the shield plate 4. The treatment position is such that the upper nozzles 5 are respectively located in the corresponding insertion holes 29 with lower surfaces 5a thereof being flush with the lower surface 26 of the shield plate 4. When the upper nozzles 5 are to be located at the treatment positions, the shield plate 4 is rotated to a nozzle insertion attitude (at a position shown in FIG. 1) by the shield plate rotation mechanism 34. The nozzle insertion attitude is such that the two insertion holes 29 are respectively located just below the intermediate positions of the two corresponding upper nozzles 5. With the shield plate 4 assuming the nozzle insertion attitude, the upper nozzles 5 are moved down. Thus, the upper nozzles 5 are respectively inserted into the corresponding insertion holes 29, and located at the treatment positions.

When the wafer W is rotated by the spin chuck 3 with the upper nozzles 5 being located at the treatment positions and with the treatment liquid being spouted from the spouts of the upper nozzles 5, the treatment liquid is supplied to the entire front surface peripheral portion 101 of the wafer W. At this time, the treatment liquid supplied to the wafer W receives a centrifugal force generated by the rotation of the wafer W to spread outward. Thus, the front surface peripheral portion 101 of the wafer W is treated.

Figure 6:
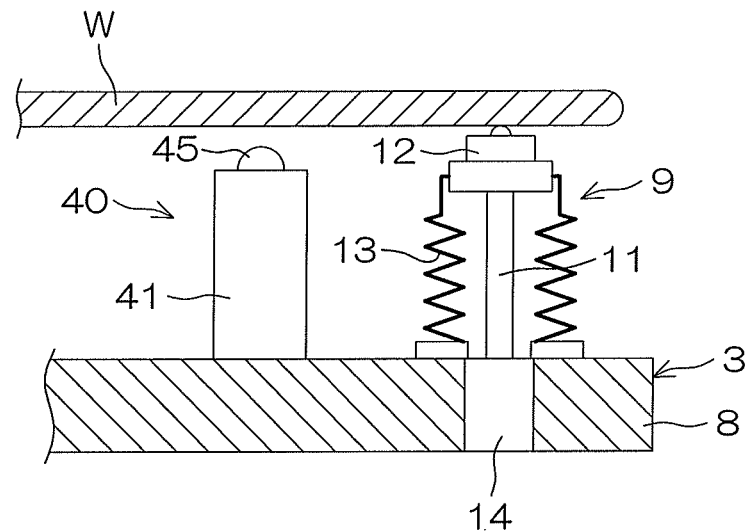
FIG. 6 is a side view of an abutment pin and an arrangement related to the abutment pin shown in FIG. 1.
Figure 7:
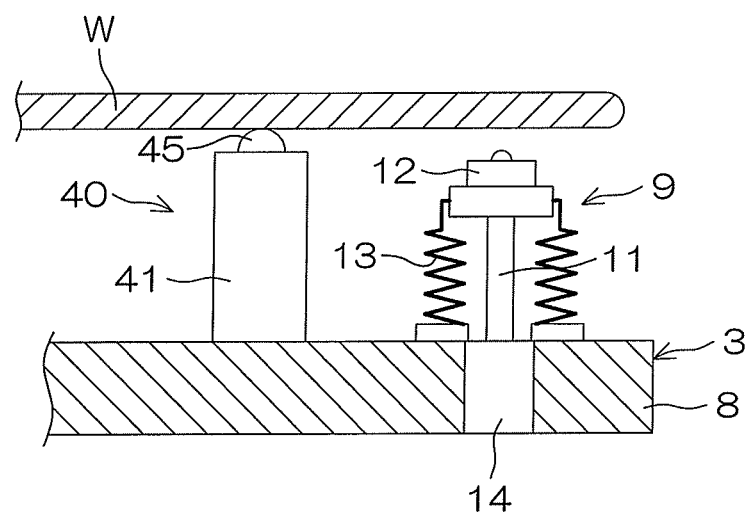
FIG. 7 is a side view of the abutment pin and the arrangement related to the abutment pin shown in FIG. 1.

FIGS. 6 and 7 are side views of the abutment pin 9 and an arrangement related to the abutment pin 9. FIG. 6 illustrates the abutment pin 9 located at the support position, and FIG. 7 illustrates the abutment pin 9 located at the retracted position.

Referring to FIGS. 2, 6 and 7, the substrate treatment apparatus 1 further includes a positioning mechanism 40 adapted to position the wafer W at a predetermined position. The positioning mechanism 40 includes two fixing pins 41 and two stoppers 42 disposed on the spin base 8, a press block 43, and a block moving mechanism 44 (see FIG. 2). The two fixing pins 41 and the two stoppers 42 are each disposed between adjacent abutment pins 9 on the peripheral portion of the upper surface of the spin base 8. One of the fixing pins 41 is angularly spaced a phase angle of approximately 180 degrees from one of the stoppers 42 about the rotation axis. Similarly, the other fixing pin 41 is angularly spaced a phase angle of approximately 180 degrees from the other stopper 42 about the rotation axis.

The fixing pins 41 each have a second support portion 45 provided at an upper end thereof. The stoppers 42 each have a third support portion 46 provided at an upper end thereof, and a stopper surface 47 to be brought into abutment against the peripheral surface 102 of the wafer W. The second support portions 45 and the third support portions 46 are configured so as to be brought into point-contact with the lower surface peripheral portion of the wafer W at the same height level. The two second support portions 45 and the two third support portions 46 cooperatively support the wafer W in abutment against the lower surface peripheral portion of the wafer W. The stopper surfaces 47 are located at positions such as to abut against the peripheral surface 102 of the wafer W when the center of the wafer W supported by the two fixing pins 41 and the two stoppers 42 is aligned with the rotation center axis L1 of the spin chuck 3. Therefore, the center of the wafer W is aligned with the rotation center axis L1 of the spin chuck 3 by causing the peripheral surface 102 of the wafer W supported by the two fixing pins 41 and the two stoppers 42 to abut against the two stopper surfaces 47.

Upper ends of the second support portions 45 are located at a lower level than upper ends of the first support portions 12 when the first support portions 12 are located at the support positions (see FIG. 6), and are located at a higher level than the upper ends of the first support portions 12 when the first support portions 12 are located at the retracted positions (see FIG. 7). Though not shown, similarly to the second support portions 45, upper ends of the third support portions 46 are located at a lower level than the upper ends of the first support portions 12 when the first support portions 12 are located at the support positions, and are located at a higher level than the upper ends of the first support portions 12 when the first support portions 12 are located at the retracted positions. Therefore, the wafer W is transferred from the abutment pins 9 to the two fixing pins 41 and the two stoppers 42 and vice versa by moving up and down the abutment pins 9 in synchronism.

The press block 43 has, for example, a cylindrical shape. The press block 43 is vertically disposed at a higher level than the spin base 8. The press block 43 is horizontally moved between an abutment position (indicated by a two-dot-and-dash line in FIG. 2) and a non-abutment position (indicated by a solid line in FIG. 2) by the block moving mechanism 44. The abutment position is such that, when the center of the wafer W supported by the two fixing pins 41 and the two stoppers 42 is aligned with the rotation center axis L1 of the spin chuck 3, an outer peripheral surface of the press block 43 abuts against the peripheral surface 102 of the wafer W. The non-abutment position is more distant from the rotation center axis L1 of the spin chuck 3 than the abutment position. When the press block 43 is moved from the non-abutment position to the abutment position in such a state that the center of the wafer W supported by the two fixing pins 41 and the two stoppers 42 is misaligned with the rotation center axis L1 of the spin chuck 3, the wafer W is horizontally pressed toward the two stopper surfaces 47 by the press block 43.

When the wafer W is to be transferred from the transport robot (not shown) to the spin chuck 3, for example, all the abutment pins 9 are preliminarily located at the retracted positions. In this state, the wafer W is transferred to the spin chuck 3. That is, the wafer W is placed on the two fixing pins 41 and the two stoppers 42. After the placement of the wafer W, the press block 43 is horizontally moved toward the abutment position by the block moving mechanism 44. If the center of the wafer W is misaligned with the rotation center axis L1 of the spin chuck 3 at this time, the press block 43 abuts against the peripheral surface 102 of the wafer W to horizontally press the wafer W. Then, the wafer W is horizontally moved until the peripheral surface 102 of the wafer W abuts against the two stopper surfaces 47. Thus, the center of the wafer W is aligned with the rotation center axis L1 of the spin chuck 3. After the press block 43 is returned to the non-abutment position, the abutment pins 9 are moved up to the support positions. The wafer W supported by the two fixing pins 41 and the two stoppers 42 is, in turn, supported by the abutment pins 9 during the upward movement of the abutment pins 9 to the support positions. Thus, the wafer W is supported by the abutment pins 9 with the center of the wafer W aligned with the rotation center axis L1 of the spin chuck 3.

Figure 8:
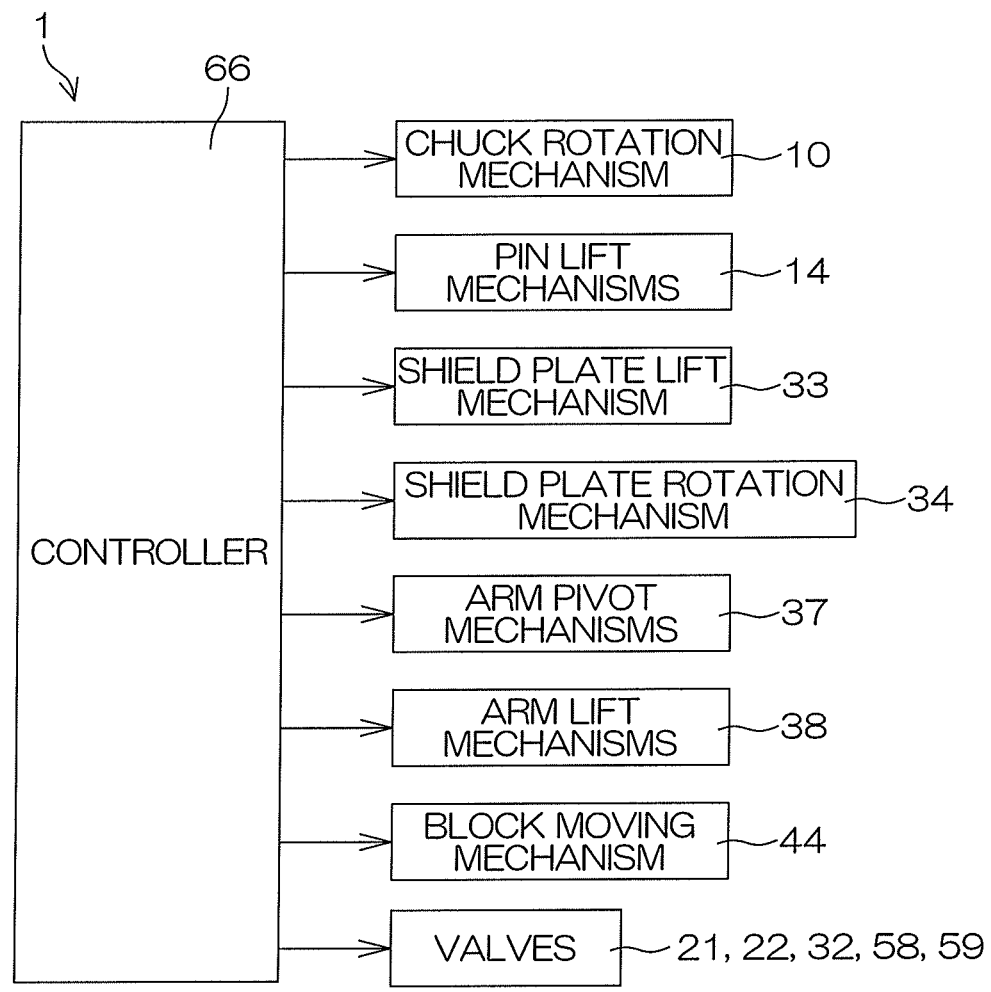
FIG. 8 is a block diagram for explaining the electrical construction of the substrate treatment apparatus shown in FIG. 1.

FIG. 8 is a block diagram for explaining the electrical construction of the substrate treatment apparatus 1.

The substrate treatment apparatus 1 includes a controller 66 including a microcomputer. The controller 66 controls operations of the chuck rotation mechanism 10, the pin lift mechanisms 14, the shield plate lift mechanism 33, the shield plate rotation mechanism 34, the arm pivot mechanisms 37, the arm lift mechanisms 38, the block moving mechanism 44 and the like. The controller 66 further controls the opening and closing of the valves 21, 22, 32, 58, 59 provided in the substrate treatment apparatus 1.

Figure 9:
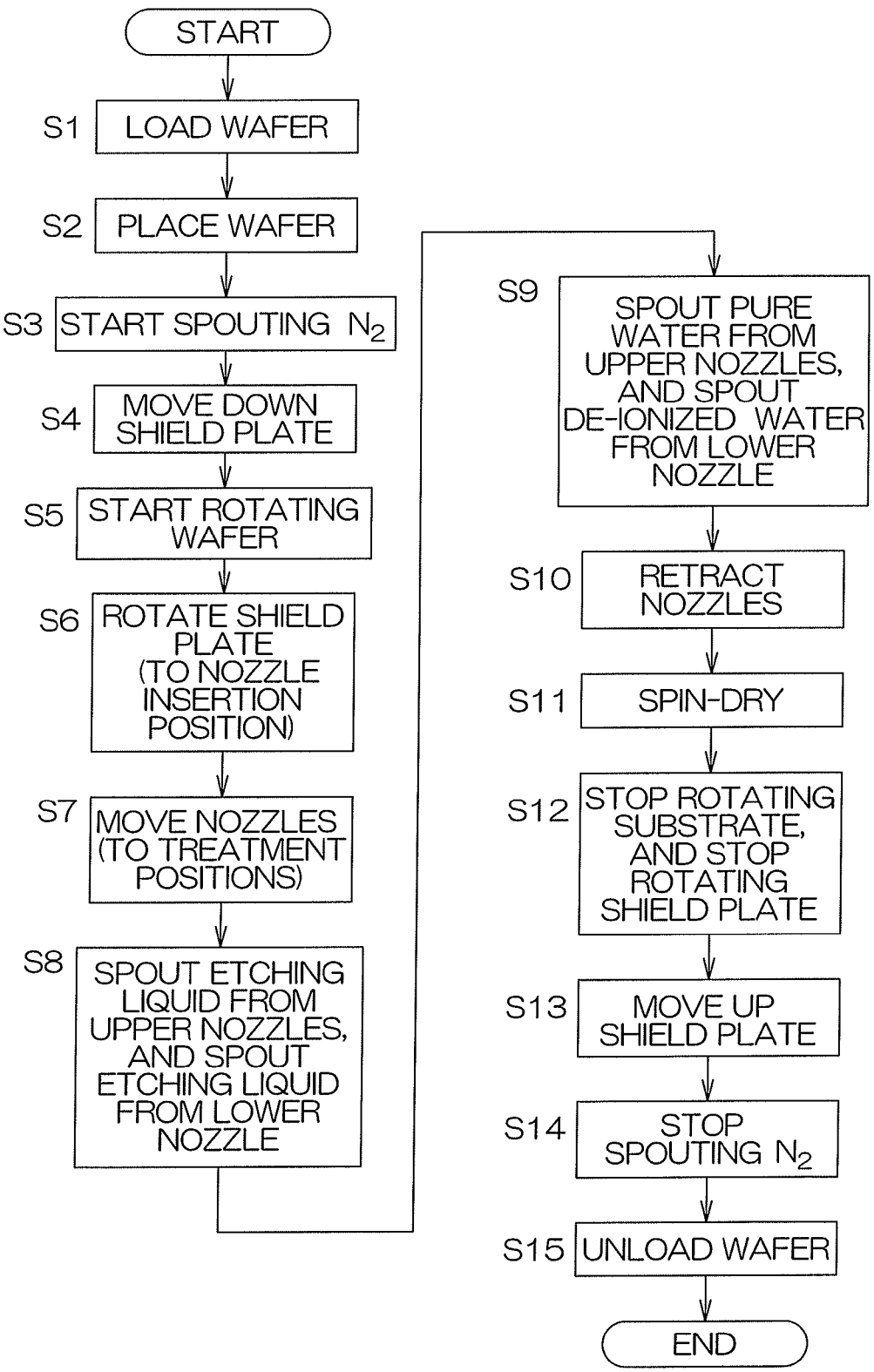
FIG. 9 is a process diagram for explaining an exemplary substrate treatment process to be performed by the substrate treatment apparatus shown in FIG. 1.
Figure 10:
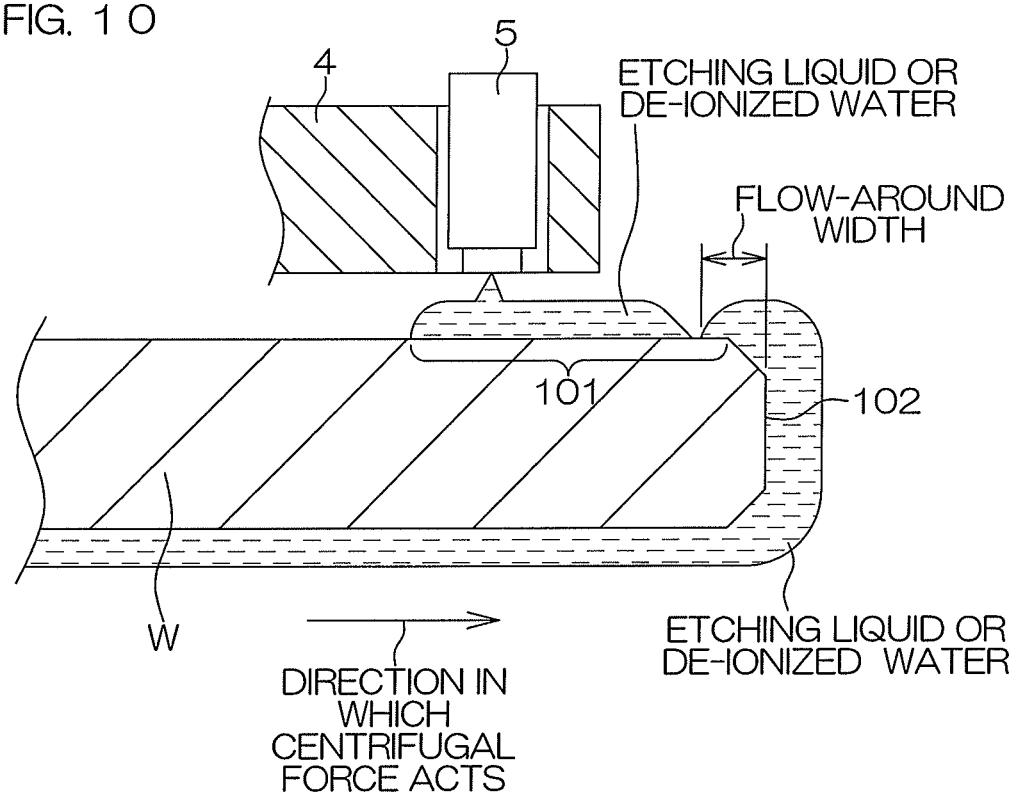
FIG. 10 is a diagram showing how to perform a simultaneous etching process or a simultaneous rinsing process.

FIG. 9 is a process diagram for explaining an exemplary process to be performed for treating the wafer W by the substrate treatment apparatus 1. FIG. 10 is a diagram showing how to perform an etching process or a rinsing process.

In a thin film removing process, a wafer W formed with a thin film is loaded into the treatment chamber (not shown) by the transport robot (not shown) with the shield plate 4 and other components being located at the retracted positions in the treatment chamber. The wafer W has the thin film on the front surface and the peripheral surface thereof. The wafer W is loaded into the treatment chamber (Step S1), and placed on the two fixing pins 41 and the two stoppers 42 with its front surface up (Step S2). Then, the controller 66 controls the block moving mechanism 44 to horizontally move the press block 43 toward the abutment position. If the center of the wafer W is misaligned with the rotation center axis L1 of the spin chuck 3 at this time, the press block 43 horizontally presses the wafer W during the movement thereof to the abutment position, whereby the peripheral surface 102 of the wafer W abuts against the two stopper surfaces 47. Thus, the center of the wafer W is aligned with the rotation center axis L1 of the spin chuck 3.

Subsequently, the controller 66 controls the block moving mechanism 44 to horizontally move the press block 43 toward the non-abutment position. Thus, the press block 43 is retracted from the abutment position. Thereafter, the controller 66 controls the pin lift mechanisms 14 to move up the abutment pins 9 to the support positions. The wafer W supported by the two fixing pins 41 and the two stoppers 42 is, in turn, supported by the abutment pins 9 during the upward movement of the abutment pins 9 to the support positions. Thus, the wafer W is supported by the abutment pins 9 with the center of the wafer W being aligned with the rotation center axis L1 of the spin chuck 3.

When the controller 66 opens the upper gas valve 32, the nitrogen gas is spouted downward from the respective gas outlet ports 27 provided in the lower surface 26 of the shield plate 4 (Step S3). Further, the controller 66 controls the shield plate lift mechanism 33 to move down the shield plate 4 from the retracted position to the proximate position (Step 4). Thus, the nitrogen gas spouted from the gas outlet ports 27 is applied onto the upper surface of the wafer W held by the spin chuck 3, whereby the wafer W is pressed against the abutment pins 9.

In this state, the controller 66 controls the chuck rotation mechanism 10 to rotate the spin base 8 about the vertical axis. Thus, the wafer W supported by the abutment pins 9 is rotated together with the abutment pins 9 due to frictional forces occurring between the wafer W and the abutment pins 9 (Step S5). Since the spin chuck 3 supports the wafer W with the frictional forces occurring between the wafer W and the abutment pins 9, it is impossible to rotate the wafer W at a higher speed in the etching process and the rinsing process. The wafer W is rotated at a rotation speed of 500 to 1000 rpm by the spin chuck 3.

In turn, the controller 66 controls the shield plate rotation mechanism 34 to rotate the shield plate 4 to the nozzle insertion attitude (Step S6). Then, the controller 66 controls the two arm pivot mechanisms 37 and the two arm lift mechanisms 38 to move the upper nozzles 5 from the retracted positions to the treatment positions (Step S7). Thus, the two upper nozzles 5 are respectively inserted into the two corresponding insertion holes 29. The shield plate 4 may be caused to assume the nozzle insertion attitude after being located at the proximate position as in this exemplary process, or before being located at the proximate position.

Subsequently, the etching process is performed on the front surface peripheral portion 101 of the wafer W and the peripheral surface 102 of the wafer W (Step S8). In this embodiment, the supply of the etching liquid from the upper nozzles 5 for the etching on the front surface peripheral portion 101 of the wafer W and the supply of the etching liquid from the lower nozzle 6 for the etching on the lower surface of the wafer W and the peripheral surface 102 of the wafer W are simultaneously effected (simultaneous etching process).

More specifically, the controller 66 opens the upper etching liquid valve 58 to spout the etching liquid from the spouts of the upper nozzles 5 toward the front surface peripheral portion 101 of the wafer W being rotated (Step S8). Thus, the etching liquid is supplied to the front surface peripheral portion 101 of the wafer W. Prior to the spouting of the etching liquid from the upper nozzles 5, the controller 66 controls the nozzle rotation mechanisms 35 to set the rotation angles of the respective upper nozzles 5 to predetermined treatment angles.

The controller 66 opens the lower etching liquid valve 21 to spout the etching liquid from the treatment liquid spout 6a of the lower nozzle 6 toward the center portion of the lower surface of the wafer W being rotated (Step S8). A space 53 defined between the lower surface of the wafer W and the upper surface 52 of the lower nozzle 6 is filled with the etching liquid spouted from the treatment liquid spout 6a to be kept in the liquid filled state, whereby the etching liquid contacts the entire opposed region A1 of the lower surface of the wafer W (see FIGS. 1 and 3).

The etching liquid contacting the lower surface of the wafer W receives a centrifugal force generated by the rotation of the wafer W to spread outward radially about the rotation center over the non-opposed region A2 of the lower surface of the wafer W (see FIGS. 1 and 3) to reach the peripheral surface 102 of the wafer W. Then, the etching liquid flows around the peripheral surface 102 to reach the front surface peripheral portion 101 of the wafer W. Thus, the etching process is performed on the front surface peripheral portion 101 of the wafer W and the peripheral surface 102 of the wafer W, whereby the thin film is removed from any region of the peripheral portion of the wafer W.

When the etching liquid supplied to the center portion of the lower surface of the wafer W flows toward the peripheral portion over the lower surface of the wafer W, the space 53 defined between the opposed region A1 of the lower surface of the wafer W and the upper surface 52 of the lower nozzle 6 is kept in the liquid filled state, so that the etching liquid is supplied to the entire opposed region A1. Therefore, the supply of the etching liquid is not influenced by the surface state (variations in hydrophilicity and the like) of the opposed region A1 of the lower surface of the wafer W. Since the etching liquid supplied to the lower surface of the wafer W uniformly spreads outward radially about the rotation center, the etching liquid is uniformly supplied at a constant flow rate to any region of the peripheral portion of the wafer W. Thus, the amount of the etching liquid flowing around from the peripheral surface 102 of the wafer W is uniform at any region of the peripheral portion of the wafer W.

In this process, the etching liquid spouted from the upper nozzles 5 is supplied to the front surface peripheral portion 101, and then receives the centrifugal force generated by the rotation of the wafer W to flow outward radially of the wafer W. On the other hand, the etching liquid flowing around to the upper surface (front surface) from the peripheral surface 102 of the wafer W is liable to move inward radially about the rotation center of the wafer W due to the surface tension thereof. Therefore, if the amount of the etching liquid flowing around from the peripheral surface 102 of the wafer W is excessively great, the etching liquid flowing around from the peripheral edge 102 of the wafer W is liable to heavily collide with the etching liquid spouted from the upper nozzles 5 and scatter around to adhere to the device formation region of the wafer W.

In this embodiment, however, the width of a region of the upper surface of the wafer W covered with the etching liquid flowing around from the peripheral edge of the wafer W as shown in FIG. 10 (flow-around width) is controlled to be very small (e.g., less than 1.0 mm). This suppresses interference between the etching liquid supplied from the lower nozzle 6 and the etching liquid supplied from the upper nozzles 5 to prevent the etching liquid from scattering around. Therefore, the etching process can be simultaneously performed on the front surface peripheral portion 101 of the wafer W, the rear surface (regions A1 and A2) of the wafer W and the peripheral surface 102 of the wafer W without adversely affecting the device formation region of the front surface of the wafer W.

During the supply of the etching liquid from the lower nozzle 6, the controller 66 controls the pin lift mechanisms 14 to alternately move up and down the first abutment pin group 9a and the second abutment pin group 9b. Thus, the support state of the wafer W is alternately switched between a state in which the wafer W is supported only by the first abutment pin group 9a and a state in which the wafer W is supported only by the second abutment pin group 9b. The etching liquid reaching the peripheral portion of the lower surface of the wafer W is also supplied to regions of the lower surface peripheral portion of the wafer W abutting against the abutment pins 9.

After a lapse of a predetermined period from the start of the spouting of the etching liquid, the controller 66 closes the upper etching liquid valve 58 and the lower etching liquid valve 21 to stop spouting the etching liquid.

Subsequently, the rinsing process is performed on the front surface peripheral portion 101 of the wafer W, the peripheral surface 102 of the wafer W and the rear surface (regions A1 and A2) of the wafer W (Step S9). In this embodiment, the supply of the de-ionized water from the upper nozzles 5 for rinsing the front surface peripheral portion 101 of the wafer W and the supply of the de-ionized water from the lower nozzle 6 for rinsing the lower surface of the wafer W and the peripheral surface 102 of the wafer W are simultaneously effected (simultaneous rinsing process).

More specifically, the controller 66 opens the upper de-ionized water valve 59 to spout the de-ionized water from the spouts of the upper nozzles 5 toward the front surface peripheral portion 101 of the wafer W being rotated (Step S9). Thus, the de-ionized water is supplied to the front surface peripheral portion 101 of the wafer W. Prior to the spouting of the de-ionized water from the upper nozzles 5, the controller 66 controls the nozzle rotation mechanisms 35 to set the rotation angles of the respective upper nozzles 5 to predetermined treatment angles.

The controller 66 opens the lower de-ionized water valve 22 to spout the de-ionized water from the treatment liquid spout 6a of the lower nozzle 6 toward the center portion of the lower surface of the wafer W being rotated (Step S9). The space 53 defined between the lower surface of the wafer W and the upper surface 52 of the lower nozzle 6 is filled with the de-ionized water spouted from the treatment liquid spout 6a to be kept in the liquid filled state, whereby the de-ionized water contacts the entire opposed region A1 of the lower surface of the wafer W. The de-ionized water contacting the lower surface of the wafer W receives the centrifugal force generated by the rotation of the wafer W to spread outward radially about the rotation center over the non-opposed region A2 of the lower surface of the wafer W to reach the peripheral surface 102 of the wafer W. Then, the de-ionized water flows around the peripheral surface 102 to reach the front surface peripheral portion 101 of the wafer W. Thus, the etching liquid adhering to the front surface peripheral portion 101 of the wafer W, the peripheral surface 102 of the wafer W and the rear surface (regions A1 and A2) of the wafer W are rinsed away.

When the de-ionized water supplied to the center portion of the lower surface of the wafer W flows toward the peripheral portion over the lower surface of the wafer W, the space 53 defined between the opposed region A1 of the lower surface of the wafer W and the upper surface 52 of the lower nozzle 6 is kept in the liquid filled state, so that the de-ionized water is supplied to the entire opposed region A1. Therefore, the supply of the de-ionized water is not influenced by the surface state (variations in hydrophilicity and the like) of the opposed region A1 of the lower surface of the wafer W. Since the de-ionized water supplied to the lower surface of the wafer W uniformly spreads outward radially about the rotation center, the de-ionized water is uniformly supplied at a constant flow rate to any region of the peripheral portion of the wafer W. Thus, the amount of the de-ionized water flowing around from the peripheral surface 102 of the wafer W is uniform at any region of the peripheral portion of the wafer W.

In this rinsing process, the de-ionized water spouted from the upper nozzles 5 is supplied to the front surface peripheral portion 101, and then receives the centrifugal force generated by the rotation of the wafer W to flow outward radially of the wafer W. On the other hand, the de-ionized water flowing around to the upper surface from the peripheral surface 102 of the wafer W is liable to move inward radially about the rotation center of the wafer W due to the surface tension thereof. Therefore, if the amount of the de-ionized water flowing around from the peripheral surface 102 of the wafer W is excessively great, the de-ionized water flowing around from the peripheral edge 102 of the wafer W is liable to heavily collide with the de-ionized water spouted from the upper nozzles 5 and scatter around to adhere to the device formation region of the wafer W.

In this embodiment, however, the width of a region of the upper surface of the wafer W covered with the de-ionized water flowing around from the peripheral edge of the wafer W as shown in FIG. 10 (flow-around width) is controlled to be very small (e.g., less than 1.0 mm). This suppresses interference between the de-ionized water spouted from the lower nozzle 6 and the de-ionized water spouted from the upper nozzles 5 to prevent the de-ionized water from scattering around. Therefore, the rinsing process can be simultaneously performed on the front surface peripheral portion 101, the rear surface (regions A1 and A2) and the peripheral surface 102 of the wafer W without adversely influencing the device formation region of the front surface of the wafer W.

During the supply of the de-ionized water from the lower nozzle 6, the controller 66 controls the pin lift mechanisms 14 to alternately moves up and down the first abutment pin group 9a and the second abutment pin group 9b. Thus, the support state of the wafer W is alternately switched between the state in which the wafer W is supported only by the first abutment pin group 9a and the state in which the wafer W is supported only by the second abutment pin group 9b. The de-ionized water reaching the peripheral portion of the lower surface of the wafer W is also supplied to the regions of the lower surface peripheral portion of the wafer W abutting against the abutment pins 9, thereby rinsing away the etching liquid adhering to the abutting regions.

After a lapse of a predetermined period from the start of the spouting of the de-ionized water, the controller 66 closes the upper de-ionized water valve 59 and the lower de-ionized water valve 22 to stop spouting the de-ionized water.

Thereafter, the controller 66 controls the two arm pivot mechanisms 37 and the two arm lift mechanisms 38 to move the upper nozzles 5 toward the retracted positions (Step S10). Thus, the upper nozzles 5 are respectively withdrawn from the insertion holes 29. After the upper nozzles 5 are moved to the retracted positions, a drying process is performed to dry (spin-dry) the wafer W.

More specifically, the controller 66 controls the chuck rotation mechanism 10 and the shield plate rotation mechanism 34 to rotate the wafer W and the shield plate 4 at a higher rotation speed (e.g., 1000 to 1500 rpm) with the nitrogen gas being spouted from the respective gas outlet ports 27 (Step S11). Thus, a greater centrifugal force acts on the treatment liquid adhering to the wafer W, whereby the treatment liquid is spun out around the wafer W. In this manner, the treatment liquid is removed from the wafer W, so that the wafer W is dried. After the drying process is performed for a predetermined period, the controller 66 controls the chuck rotation mechanism 10 and the shield plate rotation mechanism 34 to stop the rotation of the wafer W and the shield plate 4 (Step S12). The controller 66 controls the shield plate lift mechanism 33 to move up the shield plate 4 to the retracted position (Step S13). Further, the controller 66 closes the upper gas valve 32 to stop spouting the nitrogen gas from the respective gas outlet ports 27 (Step S14). Thereafter, the treated wafer W is unloaded from the treatment chamber by the transport robot (Step S15).

According to this embodiment, as described above, the space 53 defined between the lower surface of the wafer W and the upper surface 52 of the lower nozzle 6 is filled with the treatment liquid (the etching liquid or the de-ionized water) spouted from the treatment liquid spout 6a to be kept in the liquid filled state, whereby the treatment liquid contacts the entire opposed region A1 of the lower surface of the wafer W. The treatment liquid contacting the lower surface of the wafer W receives the centrifugal force generated by the rotation of the wafer W to spread outward radially about the rotation center over the non-opposed region A2 of the lower surface of the wafer W to flow around to the upper surface from the peripheral surface 102 of the wafer W.

When the treatment liquid (the etching liquid or the de-ionized water) supplied to the center portion of the lower surface of the wafer W flows toward the peripheral portion over the lower surface of the wafer W, the space 53 defined between the opposed region A1 of the lower surface of the wafer W and the upper surface 52 of the lower nozzle 6 is kept in the liquid filled state, so that the treatment liquid is supplied to the entire opposed region A1. Therefore, the supply of the treatment liquid is not influenced by the surface state of the opposed region A1 of the lower surface of the wafer W. Since the treatment liquid supplied to the lower surface of the wafer W uniformly spreads outward radially about the rotation center, the treatment liquid is uniformly supplied at a constant flow rate to any region of the peripheral portion of the wafer W. Thus, the amount of the treatment liquid flowing around from the peripheral edge of the wafer W is uniform at any region of the peripheral portion of the wafer W.

With the treatment liquid (the etching liquid or the de-ionized water) kept spouted from the lower nozzle 6, the treatment liquid puddle is formed between the lower surface of the wafer W and the upper surface 52 of the lower nozzle 6. Even if the flow rate of the treatment liquid supplied to the lower surface of the wafer W is changed, the change in supply flow rate is accommodated by the treatment liquid puddle formed on the lower surface of the wafer W. Therefore, even if the flow rate of the treatment liquid spouted from the treatment liquid spout 6a is changed, it is possible to suppress a sudden change in the flow rate of the treatment liquid supplied to the peripheral portion of the wafer W. Thus, the amount of the treatment liquid flowing around from the peripheral edge of the wafer W can be maintained at a desired level.

Since the spin chuck 3 supports the wafer W by the frictional forces occurring between the abutment pins 9 and the wafer W as described above, it is impossible to rotate the wafer W at a higher speed in the etching process and the rinsing process. In this embodiment, however, the treatment liquid flow-around amount is uniform at any region of the peripheral portion of the wafer W without the need for rotating the wafer W at a higher speed. Therefore, even if the spin chuck 3 is of a pressing type, the treatment width of the front surface peripheral portion 101 of the wafer W can be precisely controlled.

Next, a first etching test will be described.

Silicon wafers W each having a thin copper film on the front surface and the peripheral surface thereof were used as test samples. The first etching test was performed, in which the wafers W were each held and rotated by the spin chuck 3 and hydrofluoric acid was supplied as the etching liquid to the wafer W from the lower nozzle 6 shown in FIG. 4 to remove the thin copper film from the wafer W. The wafers W were each rotated at a rotation speed of 600 rpm while the etching liquid was spouted at a flow rate of 0.5 L/min toward the lower surface of the wafer W from the lower nozzle 6. In the first etching test, the following test conditions were employed, in which two types of nozzles including disk portions 51 having different diameters D1 (hereinafter each referred to as "lower nozzle diameter D1") were used as the lower nozzle 6, and the rear surface of the wafer W and the upper surface 52 of the disk portion 51 were spaced different distances D1 from each other during the etching process.

Then, the flow-around amounts of the etching liquid were measured at 12 points which were circumferentially equidistantly arranged on the front surface peripheral portion 101 of each of the wafers W, and the circumferential distribution of the flow-around amounts (a relationship between the circumferential angular positions (degree) of the respective points and the flow-around amounts of the etching liquid from the peripheral surfaces 102 of the wafers W) was determined.

Test Conditions 1
 A lower nozzle diameter D1 of 72 mm and a distance G1 of 4.5 mm were employed.
Test Conditions 2
 A lower nozzle diameter D1 of 72 mm and a distance G1 of 3.5 mm were employed.
Test Conditions 3
 A lower nozzle diameter D1 of 72 mm and a distance G1 of 3.0 mm were employed.
Test Conditions 4
 A lower nozzle diameter D1 of 72 mm and a distance G1 of 2.5 mm were employed.
Test Conditions 5
 A lower nozzle diameter D1 of 100 mm and a distance G1 of 4.5 mm were employed.

Figure 11:
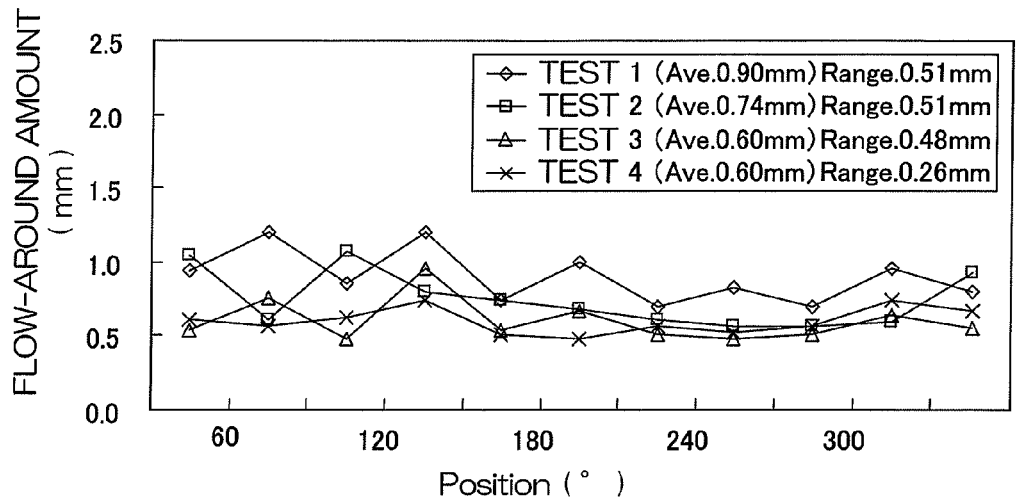
FIG. 11 is a graph showing the circumferential distribution of etching liquid flow-around amounts observed in a first etching test.
Figure 12:
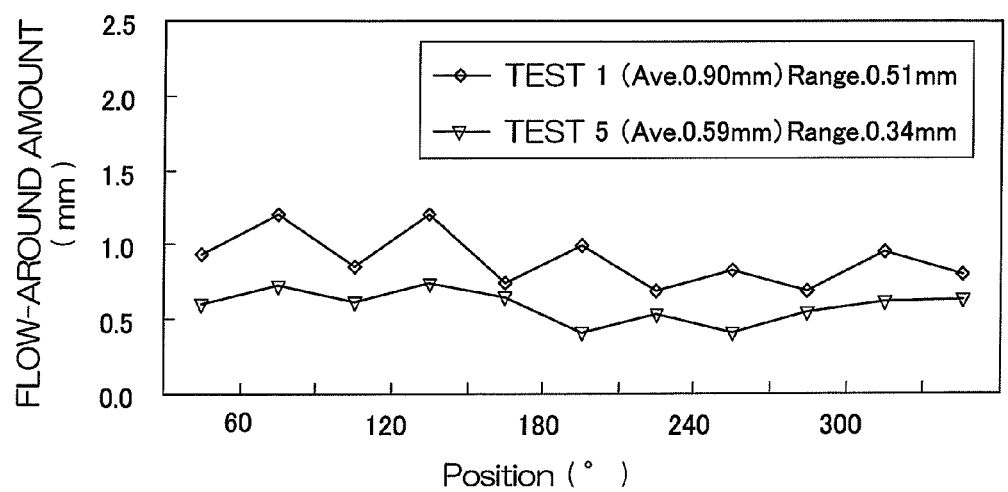
FIG. 12 is a graph showing the circumferential distribution of etching liquid flow-around amounts observed in the first etching test.

FIG. 11 is a graph showing the circumferential distribution of the flow-around amounts of the etching liquid observed under Test Conditions 1 to 4. FIG. 12 is a graph showing the circumferential distribution of the flow-around amounts measured under Test Conditions 1 and 5.

Under Test Conditions 1, the average (Ave.) of the flow-around amounts at the respective points was 0.90 mm, and a difference (Range.) between the maximum flow-around amount and the minimum flow-around amount was 0.51 mm.

Under Test Conditions 2, the average (Ave.) of the flow-around amounts at the respective points was 0.74 mm, and a difference (Range.) between the maximum flow-around amount and the minimum flow-around amount was 0.51 mm.

Under Test Conditions 3, the average (Ave.) of the flow-around amounts at the respective points was 0.60 mm, and a difference (Range.) between the maximum flow-around amount and the minimum flow-around amount was 0.48 mm.

Under Test Conditions 4, the average (Ave.) of the flow-around amounts at the respective points was 0.60 mm, and a difference (Range.) between the maximum flow-around amount and the minimum flow-around amount was 0.26 mm.

Under Test Conditions 5, the average (Ave.) of the flow-around amounts at the respective points was 0.59 mm, and a difference (Range.) between the maximum flow-around amount and the minimum flow-around amount was 0.34 mm.

As can be understood from the results shown in FIG. 11, the etching liquid flow-around amount was uniform at any region of the peripheral portion of the wafer W when the distance G1 was in the range of 2.5 to 4.5 mm. Particularly, where the distance G1 was not greater than 3.0 mm, the uniformity in flow-around amount was excellent with smaller flow-around amounts.

Next, a second etching test will be described.

Silicon wafers W each having a thin copper film on the front surface and the peripheral surface thereof were used as test samples. The wafers W were each held and rotated by the spin chuck 3, and the second etching test was performed, in which the thin copper film was removed from the wafer W by supplying hydrofluoric acid as the etching liquid. In the second etching test, the shield plate 4 and the upper nozzles 5 were opposed to the upper surface of the wafer W held by the spin chuck 3. The wafers W were each rotated at a rotation speed of 600 rpm while the etching liquid was spouted from the upper nozzles 5 and a lower nozzle. At this time, the flow rate of the etching liquid spouted from the upper nozzles 5 was 15 to 20 mL/min, and the flow rate of the etching liquid spouted from the lower nozzle was 0.5 L/min.

Inventive Example

By using the lower nozzle 6 shown in FIG. 4, the treatment liquid was spouted toward the center portion of the lower surface of the wafer W. The lower nozzle diameter D1 was 72 mm, and the distance G1 was 2.5 mm.

Comparative Example

By using a center axis nozzle as the lower nozzle, the treatment liquid was spouted toward the rotation center of the lower surface of the wafer W. At this time, the rear surface of the wafer W was spaced a distance of 2.5 to 4.5 mm from an upper end of the center axis nozzle.

Figure 13:
FIG. 13 is a photograph showing a peripheral portion of a front surface of a wafer as observed by an optical microscope in a second etching test.
Figure 14:
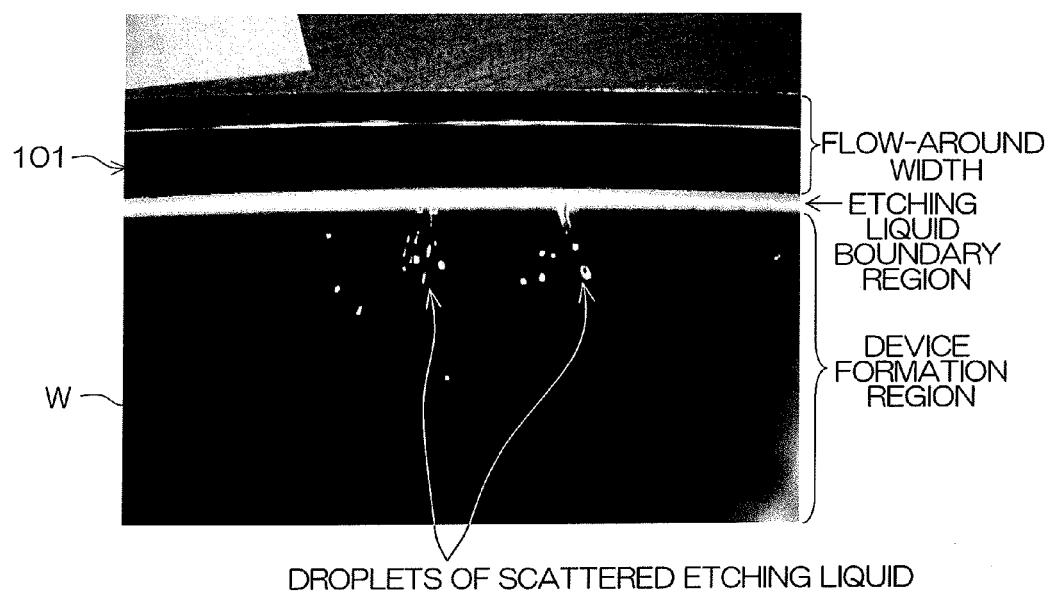
FIG. 14 is a photograph showing a peripheral portion of a front surface of another wafer as observed by the optical microscope in the second etching test.

FIG. 13 is a photograph showing the front surface peripheral portion 101 of the wafer W as observed by an optical microscope in the inventive example. FIG. 14 is a photograph showing the front surface peripheral portion 101 of the wafer W as observed by the optical microscope in the comparative example. White band portions appearing in FIGS. 13 and 14 are treatment liquid boundary regions in which the etching liquid spouted from the upper nozzles 5 and the treatment liquid spouted from the lower nozzle collided with each other.

In the comparative example shown in FIG. 14, the etching liquid flow-around amount was greater, and the treatment liquid boundary region had a greater width, indicating that the etching liquid spouted from the upper nozzles and the treatment liquid spouted from the lower nozzle heavily collided with each other. Further, droplets of the etching liquid adhered to a device formation region of the wafer W.

In the inventive example shown in FIG. 13, the flow-around amount of the etching liquid flowing around from the peripheral surface 102 of the wafer W was kept smaller, so that the width of an annular flow-around region of the front surface peripheral portion 101 of the wafer W was very small. Further, the treatment liquid boundary region had a relatively small width, indicating that there was almost no interference between the etching liquid spouted from the upper nozzles and the treatment liquid spouted from the lower nozzle. Further, no etching liquid droplet adhered to a device formation region of the wafer W.

Figure 15:
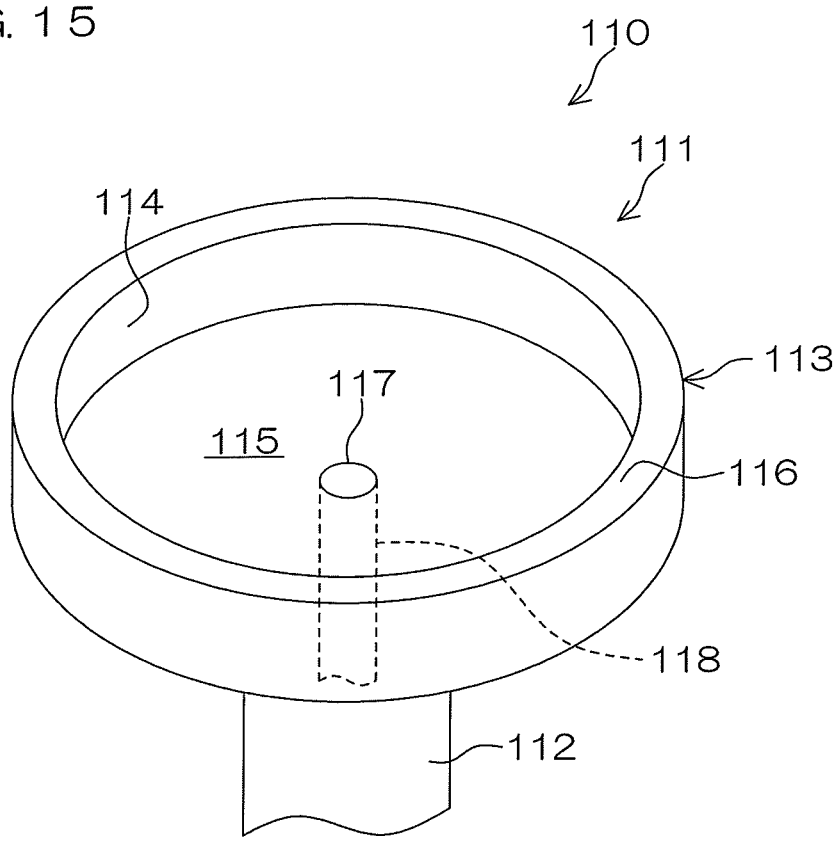
FIG. 15 is a perspective view of a lower nozzle of a substrate treatment apparatus according to a second embodiment of the present invention.

FIG. 15 is a perspective view of a lower nozzle (first nozzle) 111 of a substrate treatment apparatus 110 according to a second embodiment of the present invention. In the second embodiment, components corresponding to those described in the first embodiment shown in FIGS. 1 to 14 will be denoted by the same reference characters as in the first embodiment, and duplicate description will be omitted. The substrate treatment apparatus 110 includes the lower nozzle 111 instead of the lower nozzle 6 shown in the first embodiment.

The lower nozzle 111 includes a hollow cylindrical portion 112 fixed to the upper end of the lower treatment liquid supply pipe 15 (see FIG. 1), and a main portion 113 fixed to an upper end of the hollow cylindrical portion 112. The main portion 113 has a generally disk shape having a center aligned with the center axis of the rotation shaft 7 and a relatively great thickness (e.g., about 10 to about 15 mm). The main portion 113 and the hollow cylindrical portion 112 are integrally formed of a chemical-resistant material such as PCTFE (polychlorotrifluoroethylene).

The main portion 113 has a hollow cylindrical recess 114 provided in a center portion of an upper surface thereof. The recess 114 has a depth of, for example, about 5 to about 10 mm. The recess 114 has a bottom surface (inner opposing surface) 115 which is a horizontal flat surface present at the bottom thereof. The recess 114 has an inner diameter that is smaller than the diameter of the wafer W held by the spin chuck 3 (e.g., about one third the diameter of the wafer W). The main portion 113 has an annular upper end face (outer opposing surface) 116 which is a horizontal flat surface present at the upper portion thereof as surrounding the recess 114. The bottom surface 115 of the recess 114 has a round treatment liquid spout 117. The treatment liquid spout 117 is aligned with the center axis of the rotation shaft 7. The lower nozzle 111 is located at a height level such that a lower surface of the wafer W held by the spin chuck 3 is spaced a predetermined distance from the upper end face 116 of the main portion 113.

The treatment liquid spout 117 and the lower treatment liquid supply pipe 15 are connected to each other by a connection passage 118 extending through the main portion 113 and the hollow cylindrical portion 112. Therefore, an etching liquid or de-ionized water supplied to the connection passage 118 from the lower treatment liquid supply pipe 15 is spouted upward from the treatment liquid spout 117.

When the treatment liquid (the etching liquid or the de-ionized water) is spouted upward from the treatment liquid spout 117 with the wafer W being held and rotated by the spin chuck 3, a space defined between the lower surface of the wafer W and the bottom surface 115 and the upper end face 116 of the lower nozzle 111 is kept in a liquid filled state. Then, the treatment liquid contacts and entirely covers a region of the lower surface of the wafer W opposed to the bottom surface 115 and the upper end face 116. The treatment liquid contacting the lower surface of the wafer W receives a centrifugal force generated by the rotation of the wafer W to spread outward radially about the rotation center over a region of the lower surface of the wafer W not opposed to the bottom surface 115 and the upper end face 116 to reach the peripheral surface 102 of the wafer W.

While the two embodiments of the present invention have thus been described, the invention may be embodied in other ways.

Figure 16:
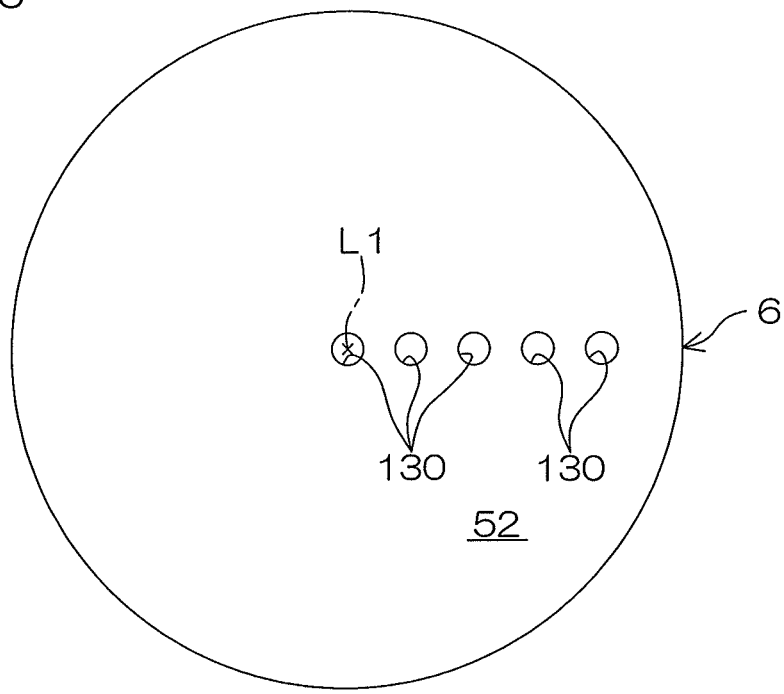
FIG. 16 is a plan view showing a variation of the lower nozzle.
Figure 17:
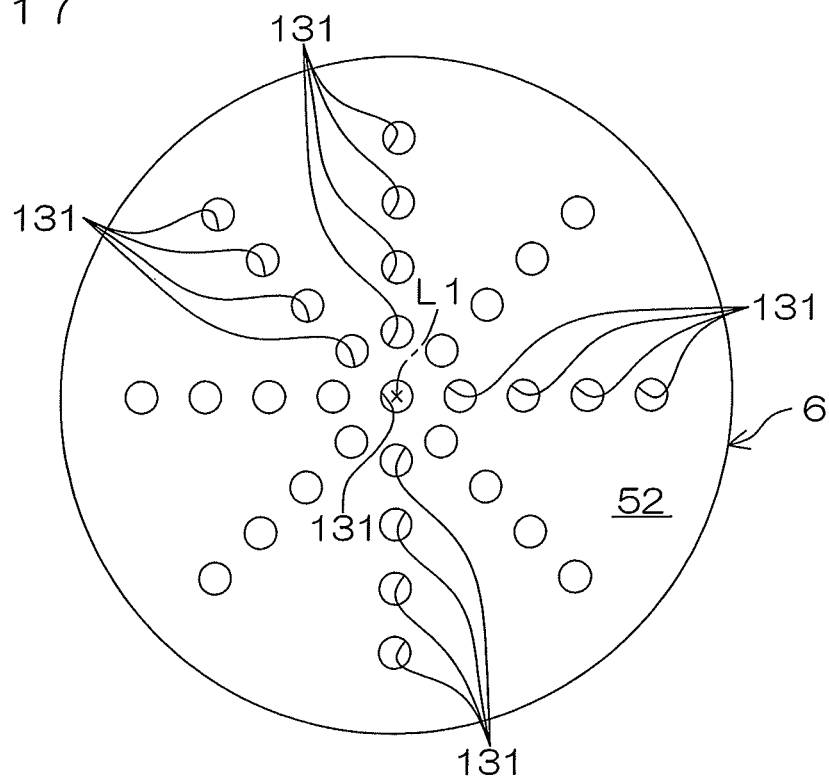
FIG. 17 is a plan view showing another variation of the lower nozzle.

The embodiments described above are directed to the case in which only one treatment liquid spout 6a or 117 is provided in the lower nozzle 6 or 111. However, the number of treatment liquid spouts 6a or 117 may be two or more. In this case, as shown in FIG. 16, a plurality of treatment liquid spouts (e.g., five treatment liquid spouts) 130 may be provided in the upper surface 52 of the lower nozzle 6 to be aligned radially of the wafer W. As shown in FIG. 17, a multiplicity of treatment liquid spouts 131 may be provided in the upper surface 52 of the lower nozzle 6 to be arranged radially about the rotation center of the wafer W. In the case shown in FIG. 16 or 17, one of the treatment liquid spouts 130 or 131 should be aligned with the rotation axis of the wafer W.

A plurality of treatment liquid spouts may be provided in the bottom surface 115 of the lower nozzle 111 to be aligned radially of the wafer W or to be arranged radially about the rotation center of the wafer W. In this case, one of the treatment liquid spouts should be aligned with the rotation axis of the wafer W.

Further, the lower nozzle 6 or 111 may be composed of a hydrophilic material such as PVC (polyvinyl chloride). In this case, the treatment liquid spouted from the treatment liquid spout 6a or the treatment liquid spout 117 has affinity for the upper surface 52 of the lower nozzle 6 or for the bottom surface 115 and the upper end face 116 of the lower nozzle 111. Therefore, the space 53 defined between the lower surface of the wafer W and the upper surface 52 or the space defined between the lower surface of the wafer W and the bottom surface 115 and the upper end face 116 of the lower nozzle 111 can be easily kept in the liquid filled state.

In the second embodiment, the bottom surface 115 of the recess 114 may be formed with a suction port. In this case, one end of a suction line extending from a suction device is connected to the suction port, and the treatment liquid present between the bottom surface 115 of the recess 114 and the wafer W is partly sucked into the suction line through the suction port by evacuating the inside of the suction port during the treatment of the wafer W. Therefore, the treatment liquid can be properly supplied to the lower surface of the wafer W by controlling the amount of the treatment liquid retained in the recess 114.

Although the embodiments described above are directed to the exemplary case in which the treatment is performed by simultaneously spouting the treatment liquid from the upper nozzles 5 and the lower nozzle 6 or 111, the cleaning of the front surface peripheral portion 101 of the wafer W with the treatment liquid spouted from the upper nozzles 5 and the cleaning of the front surface peripheral portion 101 of the wafer W with the treatment liquid spouted from the lower nozzle 6 or 111 may be achieved in different steps (by means of different units).

Although the front surface peripheral portion 101 of the wafer W is treated with the treatment liquid spouted from the upper nozzles 5 in the embodiments described above, the treatment of the front surface peripheral portion 101 of the wafer W may be achieved by causing the treatment liquid spouted from the lower nozzle 6 or 111 to flow around to the front surface peripheral portion 101 of the wafer W.

In the embodiments described above, the shield plate 4 is opposed to the upper surface of the wafer W, and the upper nozzles 5 are inserted in the insertion holes 29 of the shield plate 4. Alternatively, only the upper nozzles 5 may be provided for spouting the treatment liquid toward the front surface peripheral portion 101 of the wafer W without the provision of the shield plate 4.

Besides the etching liquid and the de-ionized water, a cleaning chemical agent such as SC1 (ammonia-hydrogen peroxide mixture) may be used as the treatment liquid to be spouted from the treatment liquid spout 6a or 117 of the lower nozzle 6 or 111.

While the present invention has been described in detail by way of the embodiments thereof, it should be understood that these embodiments are merely illustrative of the technical principles of the present invention but not limitative of the invention. The spirit and scope of the present invention are to be limited only by the appended claims.

This application corresponds to Japanese Patent Application No. 2010-79527 filed in the Japanese Patent Office on Mar. 30, 2010, the disclosure of which is incorporated herein by reference in its entirety.

What is claimed is:

1. A substrate treatment apparatus arranged to treat a peripheral portion of a substrate with a treatment liquid, the apparatus comprising:

a substrate holding unit which horizontally holds the substrate;

a rotating unit which rotates the substrate held by the substrate holding unit about a vertical axis;

a first nozzle having a first opposing face to be opposed to a region of a lower surface of the substrate inward of the peripheral portion in spaced relation to the lower surface of the substrate during rotation of the substrate by the rotating unit, and a treatment liquid spout provided in the first opposing face arranged to spout the treatment liquid to fill a space defined between the lower surface of the substrate and the first opposing face with the treatment liquid spouted from the treatment liquid spout to keep the space in a liquid filled state;

a treatment liquid supplying unit which supplies the treatment liquid to the first nozzle; and a rotation control unit which controls the rotating unit;

wherein the rotation control unit and the first nozzle cooperatively define an amount of the treatment liquid flowing around from the lower surface to the upper surface of the substrate, so as to control a treatment width of the peripheral portion of an upper surface of the substrate;

wherein the first opposing face includes an inner opposing surface provided with the treatment liquid spout, and an outer opposing surface provided annularly around the inner opposing surface to be brought into more closely opposed relation to the lower surface of the substrate held by the substrate holding unit than the inner opposing surface, the outer opposing surface having an inner periphery that defines an opening having substantially the same shape and size as the inner opposing surface such that an entire area of the inner opposing surface is opposed to the lower surface of the substrate through the opening, and wherein a recess having an inner diameter smaller than a diameter of the substrate is defined by the inner opposing surface and the outer opposing surface, and the recess is arranged to be filled with the treatment liquid spouted from the treatment liquid spout.

2. The substrate treatment apparatus according to claim 1, wherein a portion of the first nozzle including the first opposing face is composed of a hydrophilic material.

3. The substrate treatment apparatus according to claim 1, further comprising a second nozzle which spouts the treatment liquid toward a part of a peripheral portion of an upper surface of the substrate held by the substrate holding unit.

4. The substrate treatment apparatus according to claim 3, further comprising:
   an opposing member having a second opposing face to be opposed to the upper surface of the substrate held by the substrate holding unit, and an insertion hole which opens in the second opposing face;
   wherein the second nozzle is arranged to be inserted in the insertion hole.

5. A substrate treatment method of treating a peripheral portion of a substrate with a treatment liquid by spouting the treatment liquid from a first nozzle having an opposing face to be brought into opposed spaced relation to a lower surface of the substrate, the method comprising:
   a rotating step of rotating the substrate about a vertical axis;
   a step of supplying the treatment liquid to a space defined between the lower surface of the substrate and the opposing face from a treatment liquid spout provided in the opposing face so that the treatment liquid flows around from the lower surface to the upper surface of the substrate;
   a lower surface liquid contacting step of maintaining the space defined between the lower surface of the substrate and the opposing face in a liquid filled state to cause the treatment liquid to contact the lower surface of the substrate, the lower surface liquid contacting step being performed simultaneously with the rotating step and the treatment liquid supplying step; and
   a step of controlling a treatment width of the peripheral portion of the upper surface of the substrate by controlling the substrate rotation in conjunction with the supply of treatment liquid to the first nozzle, so as to control an amount of the treatment liquid flowing around from the lower surface to the upper surface of the substrate to be generally uniform at any region of the peripheral portion of the substrate,
   wherein the opposing face includes:
   an inner opposing surface provided with the treatment liquid spout;
   an outer opposing surface provided annularly around the inner opposing surface and arranged to be brought into more closely opposed relation to the lower surface of the substrate than the inner opposing surface, the outer opposing surface having an inner periphery that defines an opening having substantially the same shape and size as the inner opposing surface such that an entire area of the inner opposing surface is opposed to the lower surface of the substrate through the opening,
   the first nozzle has a recess defined by the inner opposing surface and surrounded by the outer opposing surface in plan view, and
   the lower surface liquid contacting step includes the step of supplying the treatment liquid from the treatment liquid spout to fill the recess.

6. The substrate treatment method according to claim 5, further comprising:
   an upper surface treatment liquid supplying step of spouting the treatment liquid toward a part of a peripheral portion of an upper surface of the substrate from a second nozzle, the upper surface treatment liquid supplying step being performed simultaneously with the rotating step and the lower surface liquid contacting step.

7. The substrate treatment method according to claim 6, further comprising:
   an opposing member placing step of placing an opposing member in opposed relation to the upper surface of the substrate, the opposing member having an insertion hole in which the second nozzle is to be inserted, the opposing member placing step being performed simultaneously with the rotating step, the lower surface liquid contacting step and the upper surface treatment liquid supplying step; and
   a nozzle placing step of inserting the second nozzle into the insertion hole of the opposing member to place the second nozzle in opposed relation to the upper surface of the substrate, the nozzle placing step being performed simultaneously with the opposing member placing step.

8. The substrate treatment apparatus according to claim 1, wherein the rotation control unit and the first nozzle cooperatively define the amount of the treatment liquid flowing around from the lower surface to the upper surface of the substrate by controlling the rotating unit to rotate the substrate while keeping the space between the lower surface of the substrate and the first opposing face in a state in which the space is filled with the treatment liquid.

9. The substrate treatment apparatus according to claim 1, wherein the first opposing face is smaller than the substrate in plan view.

10. The substrate treatment apparatus according to claim 1, wherein the inner opposing surface is a generally horizontal flat surface.

11. The substrate treatment apparatus according to claim 9, further comprising a second nozzle which spouts the treatment liquid toward a part of a peripheral portion of an upper surface of the substrate held by the substrate holding unit.

12. The substrate treatment apparatus according to claim 11, further comprising:
   an opposing member having a second opposing face to be opposed to the upper surface of the substrate held by the substrate holding unit, and an insertion hole which opens in the second opposing face;
   wherein the second nozzle is arranged to be inserted in the insertion hole.

13. The substrate treatment method according to claim 5, wherein the opposing face is smaller than the substrate in plan view.

14. The substrate treatment method according to claim 5, wherein the opposing face includes a flat surface to be opposed to the lower surface of the substrate.

15. The substrate treatment method according to claim 5, wherein a portion of the first nozzle including the opposing face is composed of a hydrophilic material.

16. The substrate treatment apparatus according to claim 1, wherein the inner diameter of the recess is smaller than a half of the diameter of the substrate.

17. The substrate treatment apparatus according to claim 1, wherein the inner diameter of the recess is approximately one third of the diameter of the substrate.

18. The substrate treatment method according to claim 5, wherein an inner diameter of the recess is smaller than a half of a diameter of the substrate.

19. The substrate treatment method according to claim 9, wherein an inner diameter of the recess is approximately one third of a diameter of the substrate.

\* \* \* \* \*